(12) United States Patent
Ely et al.

(10) Patent No.: US 10,606,218 B1
(45) Date of Patent: Mar. 31, 2020

(54) CERAMIC WEAVE FOR LOW-COST, STRUCTURAL, ANTENNA-PERMEABLE WATCH CASE

(71) Applicant: Apple Inc., Cupertino, CA (US)

(72) Inventors: Colin M. Ely, Sunnyvale, CA (US); Scott W. Slabaugh, Gilroy, CA (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 16/141,885

(22) Filed: Sep. 25, 2018

(51) Int. Cl.
| | |
|---|---|
| *G06F 1/16* | (2006.01) |
| *G04G 17/08* | (2006.01) |
| *B29C 70/02* | (2006.01) |
| *B29C 70/22* | (2006.01) |
| *D03D 15/00* | (2006.01) |
| *H01Q 1/27* | (2006.01) |
| *H05K 5/02* | (2006.01) |
| *H01Q 1/24* | (2006.01) |

(52) U.S. Cl.
CPC ........... *G04G 17/08* (2013.01); *B29C 70/023* (2013.01); *B29C 70/22* (2013.01); *D03D 15/00* (2013.01); *H01Q 1/243* (2013.01); *H01Q 1/273* (2013.01); *H05K 5/0217* (2013.01); *C04B 2235/5224* (2013.01); *C04B 2235/5236* (2013.01); *D10B 2101/08* (2013.01)

(58) Field of Classification Search
CPC .............................. G06F 1/1601; G06F 1/163
USPC ....................................... 361/679.01–679.03
See application file for complete search history.

(56) References Cited

U.S. PATENT DOCUMENTS

2014/0146448 A1* 5/2014 Yoo .................. B29C 45/14811
361/679.01
2015/0091418 A1* 4/2015 Chung ................ H04M 1/0249
312/223.1

* cited by examiner

*Primary Examiner* — Anthony Q Edwards
(74) *Attorney, Agent, or Firm* — Dorsey & Whitney LLP

(57) ABSTRACT

A composite housing of an electronic device can include a substrate having a shape that partially defines an internal volume of the electronic device and includes ceramic fibers arranged in a weave pattern and embedded in a matrix material. The composite housing can also include an overmold material at least partially surrounding the substrate and an antenna integrated into the overmold material.

20 Claims, 18 Drawing Sheets

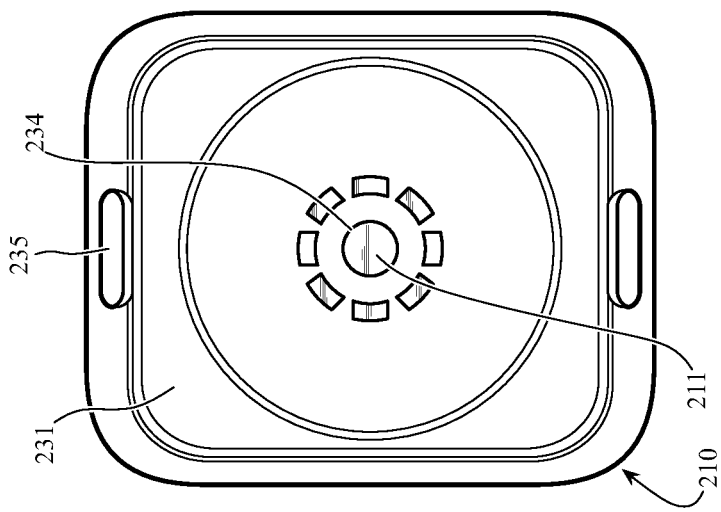
FIG. 4E
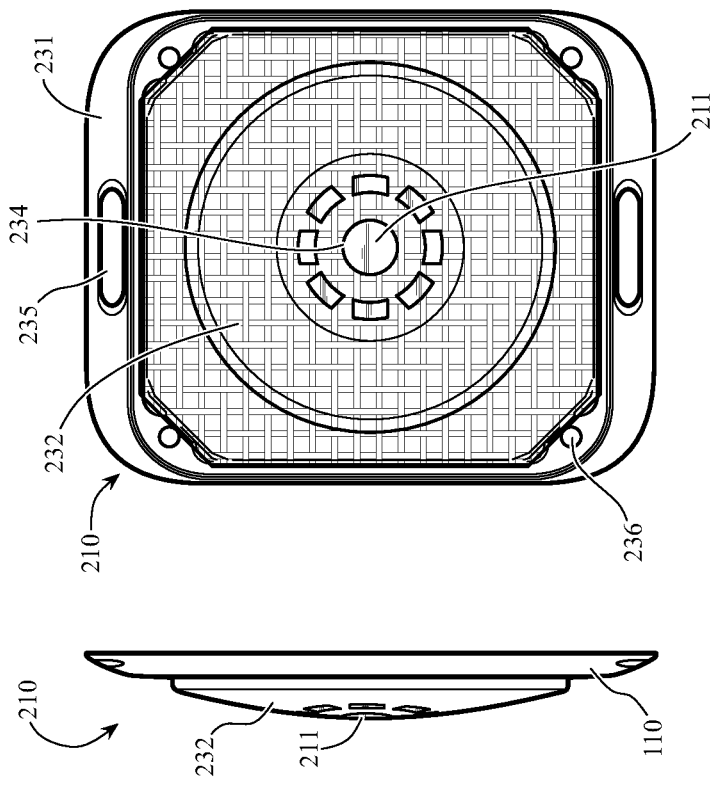
FIG. 4C
FIG. 4B
FIG. 4D
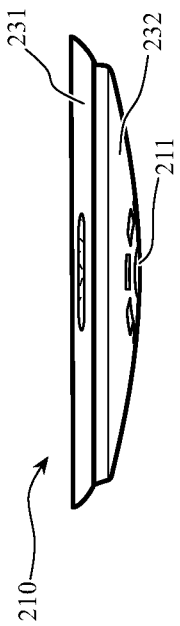
FIG. 4F

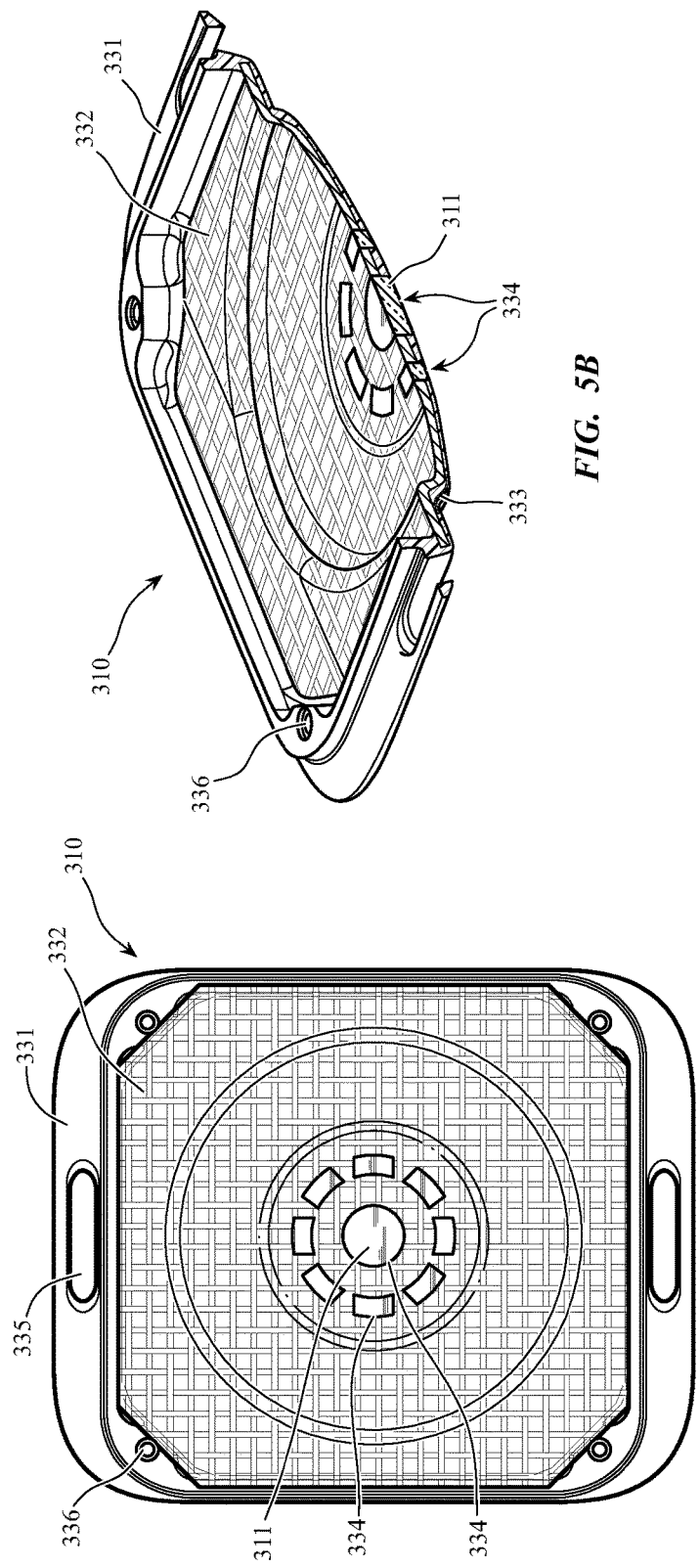
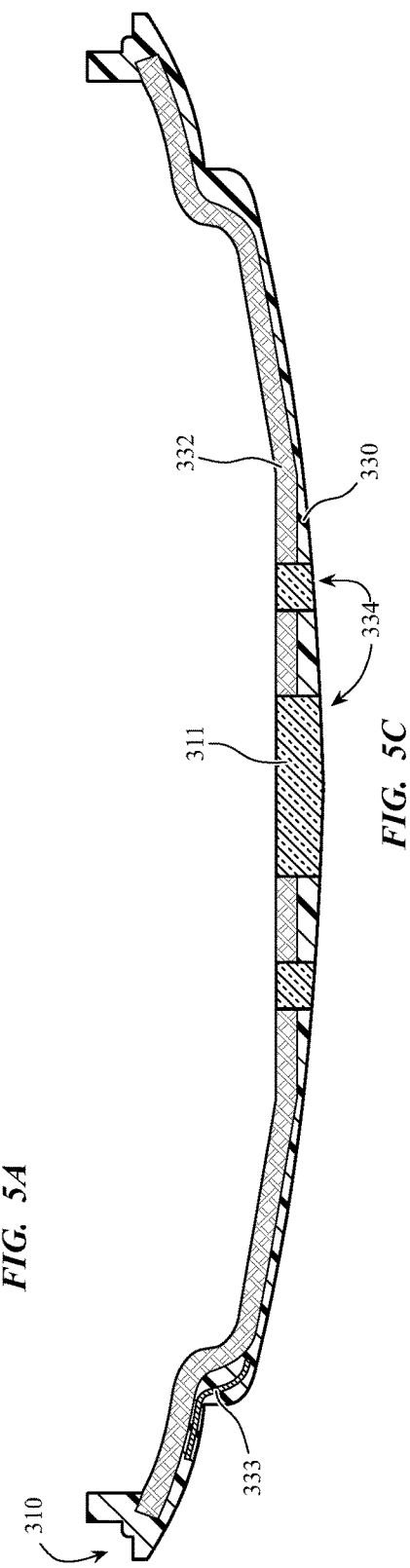

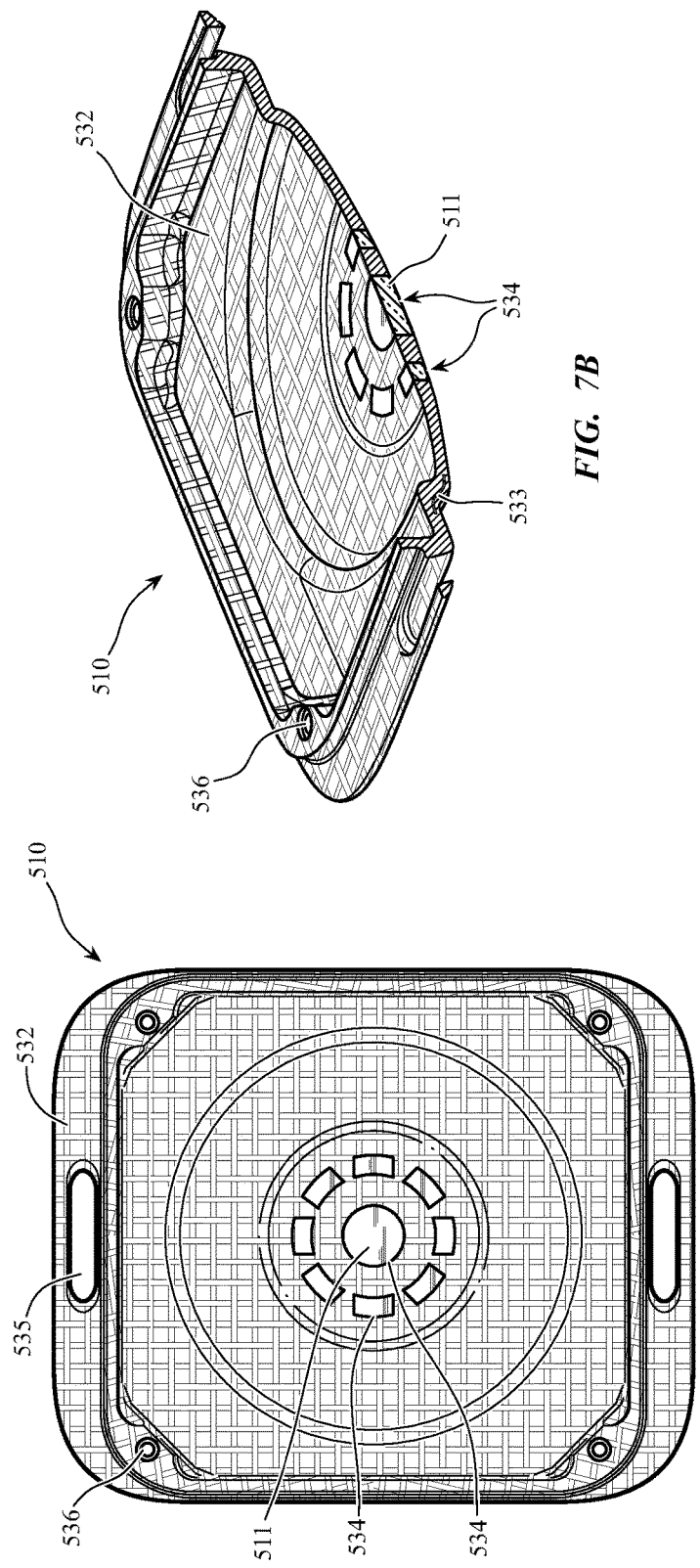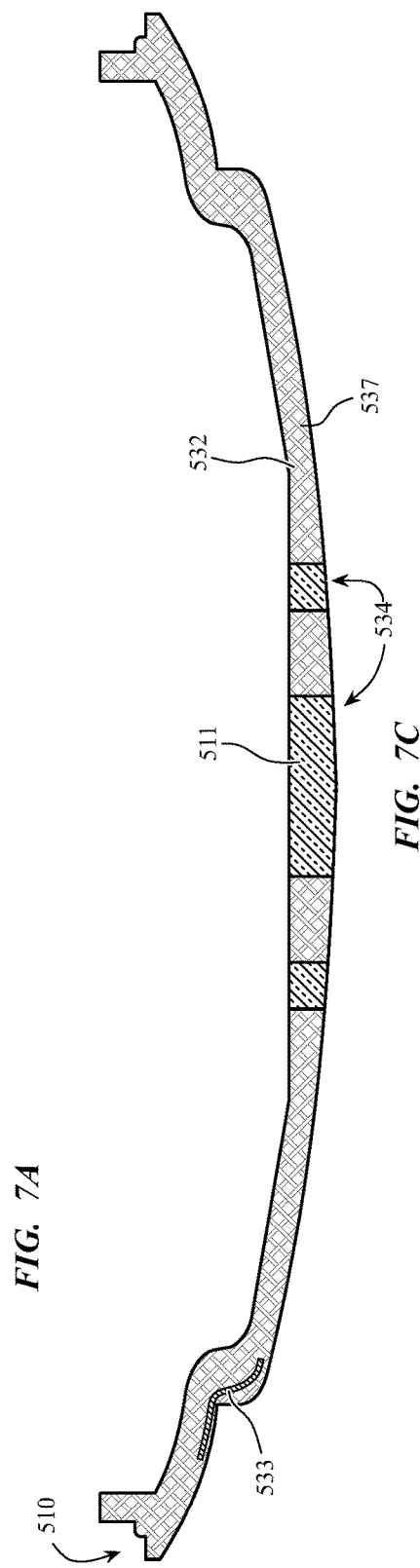

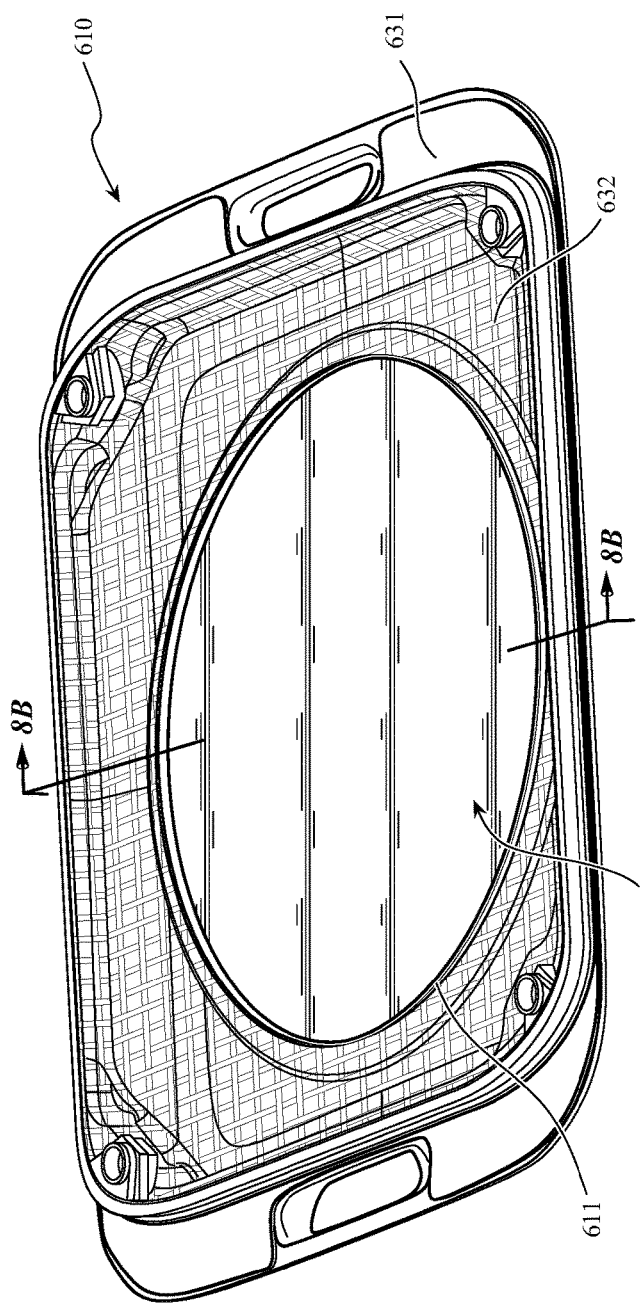
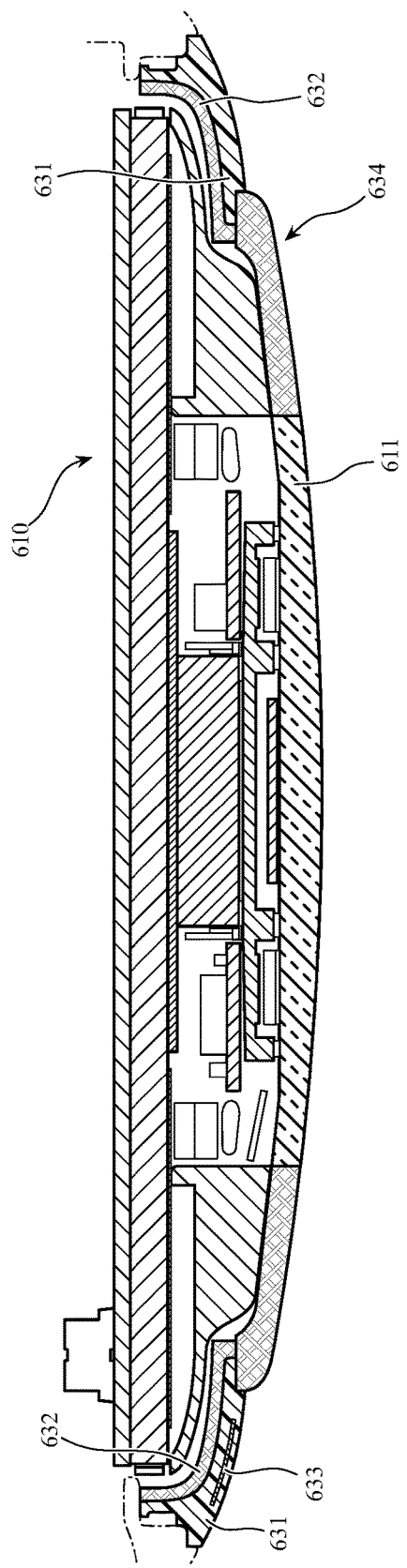
FIG. 8A
FIG. 8B

CERAMIC WEAVE FOR LOW-COST, STRUCTURAL, ANTENNA-PERMEABLE WATCH CASE

FIELD

The described embodiments relate generally to composite articles for electronic devices. More particularly, the present embodiments relate to ceramic composite articles for electronic devices and methods of forming the same.

BACKGROUND

Electronic devices are widespread in society and can take a variety of forms, from wristwatches to computers. Electronic devices, including portable electronic devices such as handheld phones, tablet computers, and watches, can experience contact with various surfaces during use. Further, the use, transportation, and storage of such devices can exert mechanical and thermal stresses thereon.

Components for these devices, such as housings, can benefit from exhibiting different combinations of properties relating to the use of the device. A housing for a portable electronic device can have a combination of properties, such as strength, appearance, toughness, abrasion resistance, electromagnetic shielding, and cost, in order for the device to function as desired. Certain materials can provide a desired level of performance with respect to some properties, but not others. For example, a metal housing can be strong and tough, but can provide varying levels of electromagnetic shielding. A plastic housing can be electromagnetically transparent, but can have lower levels of strength, toughness, and abrasion resistance. Ceramic materials can be stronger than plastic, but can be more expensive to form and machine.

SUMMARY

One aspect of the present disclosure relates to a housing of an electronic device including a substrate having a shape partially defining an internal volume of the electronic device and including ceramic fibers arranged in a weave pattern. The weave pattern can be embedded in a matrix material. Additionally, an overmold material can at least partially surround the substrate. An operational component, such as an antenna, can be integrated into the overmold material.

In some embodiments, the housing can further include an aperture passing through the substrate and overmold material. A transparent element can be positioned within the aperture, and the overmold material can include an attachment feature to attach a component of the electronic device to the housing. The antenna can be a cellular antenna. The substrate can amplify a signal transmitted or received by the operational component, such as an antenna. The ceramic fibers can include zirconia or alumina. The matrix material can include a thermoset polymer, thermoplastic polymer, or combinations thereof. The overmold material can include a polymer. The weave pattern can be a fabric weave pattern. The weave pattern can be a satin weave pattern.

Another aspect of the present disclosure relates to a component of an electronic device including a substrate. The substrate can include a ceramic material, an overmold material at least partially surrounding the substrate, and an operational component, such as an antenna, at least partially surrounded by the overmold material.

In some embodiments, the ceramic material can include ceramic fibers, and the substrate can include the ceramic fibers embedded in a matrix material. The ceramic fibers can be arranged in a weave pattern. The ceramic fibers can be substantially randomly oriented throughout the substrate. The matrix material can include a thermoset polymer, thermoplastic polymer, or combinations thereof. The ceramic material can include zirconia or alumina. The overmold material can include a polymer.

Another aspect of the present disclosure relates to a method of forming a component of an electronic device, including solidifying a matrix material at least partially around ceramic fibers to form a substrate, cutting the substrate into a desired shape, disposing an antenna or other operational component adjacent to the substrate, and overmolding the substrate and the operational component with a moldable material so that the moldable material at least partially surrounds the substrate and the operational component.

In some embodiments, cutting the substrate can include laser-cutting the substrate to form an aperture therein. The ceramic fibers can be arranged in a weave pattern. The ceramic fibers can be substantially randomly oriented throughout the matrix material.

BRIEF DESCRIPTION OF THE DRAWINGS

The disclosure will be readily understood by the following detailed description in conjunction with the accompanying drawings, wherein like reference numerals designate like structural elements, and in which:

FIG. 4B shows a top view of a component of the electronic device of FIG. 4A.

FIG. 4C shows a bottom view of a component of the electronic device of FIG. 4A.

FIG. 4D shows a side view of a component of the electronic device of FIG. 4A.

FIG. 4E shows a side view of a component of the electronic device of FIG. 4A.

FIG. 4F shows a front view of a component of the electronic device of FIG. 4A.

FIG. 5A shows a top view of a component of an electronic device.

FIG. 5B shows a perspective cut-away view of a component of the electronic device of FIG. 5A.

FIG. 5C shows a sectional view of a component of the electronic device of FIG. 5A.

FIG. 7A shows a top view of a component of an electronic device.

FIG. 7B shows a perspective cut-away view of a component of the electronic device of FIG. 7A.

FIG. 7C shows a sectional view of a component of the electronic device of FIG. 7A.

FIG. 8A shows a top view of a component of an electronic device.

FIG. 8B shows a perspective cut-away view of a component of the electronic device of FIG. 8A.

DETAILED DESCRIPTION

Figure 1:
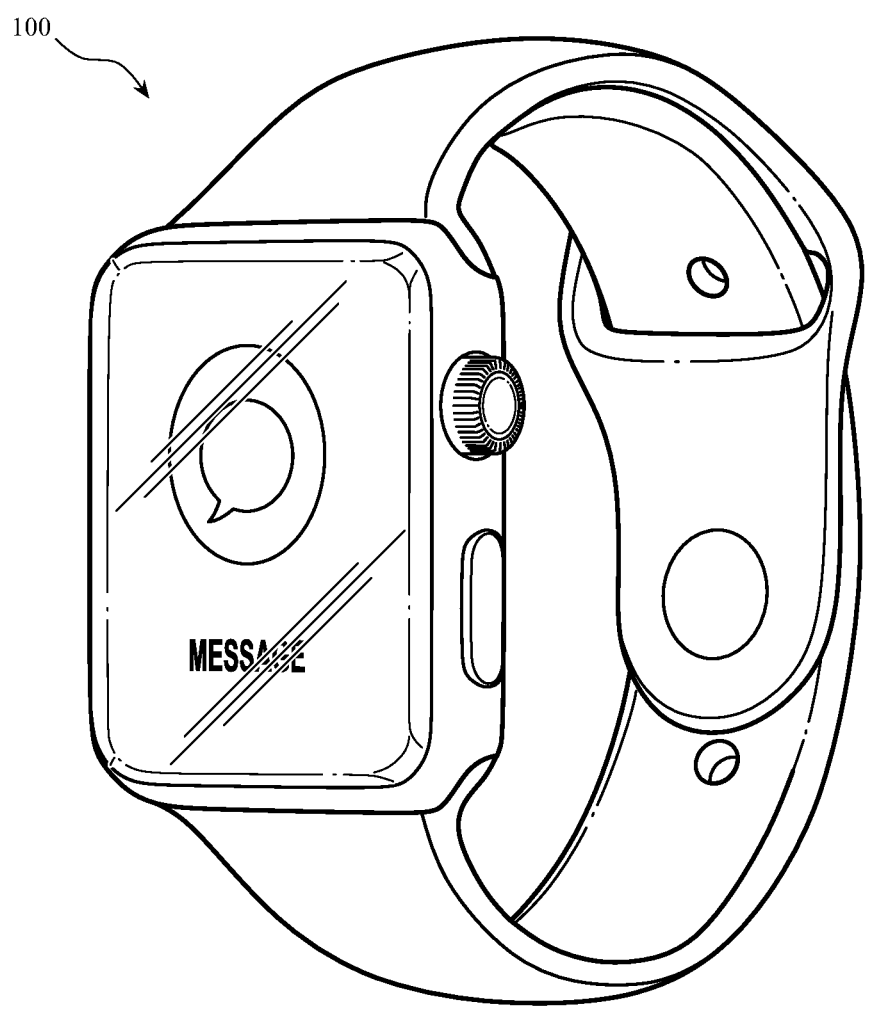
FIG. 1 shows a perspective view of an electronic device.

The present description provides examples, and is not limiting of the scope, applicability, or configuration as set forth in the claims. Thus, it will be understood that changes can be made in the function and arrangement of elements discussed without departing from the spirit and scope of the disclosure, and various embodiments can omit, substitute, or add other procedures or components as appropriate. For instance, methods described can be performed in an order different from that described, and various steps can be added, omitted, or combined. Also, features described with respect to some embodiments can be combined in other embodiments.

One aspect of the present disclosure relates to composite components of electronic devices, such as, for example, all or a portion of a housing of an electronic device. The composite housing can include a substrate and an overmolded material at least partially surrounding the substrate. In some examples, an operational component, such as an antenna, can be integrated into or at least partially surrounded by the overmolded material. The antenna can transmit and/or receive wireless signals, for example, via a cellular network, Wi-Fi network, Bluetooth, and other similar wireless networks.

In some cases, the composite housing can allow wireless signals to be transmitted or received with less interference, attenuation, or shielding than if the housing were constructed entirely of a single material, such as a ceramic or metal material. In some cases, the composite housing, or a portion thereof, can amplify a wireless signal transmitted or received by the antenna. In some cases, the composite housing can have a high strength, toughness, and durability relative to a housing formed of a single material, such as a polymer. Further, the overmold material can provide a pleasing aesthetic appearance to the housing.

The substrate of the composite housing can include a ceramic material at least partially embedded in a matrix material. In some cases, the ceramic material can include ceramic fibers that can be arranged in a pattern, such as a weave pattern. A matrix material, such as a resin or epoxy, can partially, substantially, or entirely surround the ceramic fibers such that the ceramic fiber weave can be embedded in the matrix material. In some cases, the ceramic fibers can serve to amplify or reduce interference, attenuation, or shielding of wireless signals received or transmitted by the antenna.

A moldable material can be overmolded to at least partially surround the substrate. The overmold material can include any moldable material, such as a polymeric material. For example, the overmold material can include a polyamide material. Further, in some cases, the overmold material can include glass fibers embedded therein. The overmold material can be formed around the substrate such that the substrate and the overmold material form a single component. The overmold material can coat substantially an entire surface of the substrate defining an exterior portion of the housing, such that the overmold material forms an exterior portion of the housing.

The overmold material can have a higher durability and resistance to chemical attack than the substrate or a material forming the substrate. As such, the overmold material can provide for a housing with high durability and toughness, while the substrate can provide for a housing that has a very high strength. In this way, the substrate and the overmold material can cooperate to provide a housing with any number of desirable properties. Further, because the housing is not formed from a single material, such as a ceramic, the material and the processing costs of the housing can be greatly reduced relative to an entirely ceramic housing.

The materials and structures of the components, substrates, overmold materials, and antennas discussed herein can include any desired design or shape to serve any number of functions, or to provide any number of specifically tailored properties. The following discussion of composite components illustrates a variety of different embodiments and designs for use in electronic devices. Further, the materials, structures, and features discussed herein can be combined in any number or manner.

In some examples, the substrate can be designed to enhance a number of mechanical or other characteristics of a component, such as a housing. For example, the substrate can have a design that includes one or more ceramic structures that span the substrate in one or more directions. Such a structure can include a substantially solid ceramic component or ceramic fibers. In some cases, the ceramic fibers can be substantially randomly positioned throughout the substrate. In some other examples, however, the ceramic fibers can be arranged in a pattern, such as a weave. These ceramic structures can enhance the resistance of the component to bending or flexure, thereby providing a component that is much stronger and stiffer than, for example, a polymer housing. The ceramic material can include zirconia, alumina, or combinations thereof.

In some examples, the ceramic material is at least partially embedded in a matrix material. Thus, in some cases, the substrate can be a ceramic composite material. The matrix material can be a moldable or curable material, such as an epoxy or a resin. In some cases, the matrix material can include metallic material, amorphous materials such as glass, polymeric materials, or other compatible materials. The substrate can have a substantially uniform thickness, or in some cases, can vary in thickness along one or more dimensions. In some examples, the substrate can be from about 0.25 mm thick to about 1 mm thick, or even thicker. In some examples, the substrate can be about 0.5 mm thick.

The substrate can have any desired shape or design and, in some cases, can partially define an internal volume of an electronic device. In some examples, the substrate can include one or more apertures to allow one or more components of the electronic device to have visual or physical access to the environment exterior to the device. In some cases, a material, such as a visually transparent material, can have a peripheral shape corresponding to a shape of an aperture in the substrate and can be positioned therein. In some cases, the aperture and the transparent material can cooperate to allow for a component, such as a sensor, to detect one or more properties of the environment exterior to the electronic device. The transparent material can be a visually transparent material, such as sapphire or a transparent polymer.

The overmold material that, in some examples, can at least partially surround the substrate, can include any moldable material or combinations thereof. In some examples, the overmold material can be a metallic material, an amorphous material, or a polymeric material such as a polyamide. Further, in some cases, one or more additional materials can be included in the overmold material. For example, the overmold material can be a polyamide with glass fibers embedded therein.

In some cases, the overmold material can form or be an exterior surface of the component. Further, in some examples where the composite component is a housing of an electronic device, the overmold material can form or be an exterior surface of the electronic device. In some cases, the overmold material can have a thickness of from about 0.1 mm to about 0.5 mm, or from about 0.25 mm to about 0.45 mm.

An operational component, such as an antenna, can be integrated into or at least partially surrounded by the overmold material of the composite component. In some examples, the antenna can be substantially or entirely surrounded by the overmold material. In one example, one or more portions of the antenna configured to connect to or communicate with other components of the electronic device may protrude from or otherwise be exposed from the overmold material.

The antenna can include, or be formed from, a metal. In some cases, the antenna can include a substantially flat sheet of metal. In some other cases, however, the antenna can include any desired shape to receive and/or transmit wireless signals, such as signals of one or more desired frequencies. In some examples, the antenna can receive and/or transmit wireless signals at one or more frequencies, and can be, for example, one or more of a cellular antenna such as an LTE antenna, a Wi-Fi antenna, a Bluetooth antenna, a GPS antenna, a multi-frequency antenna, or another suitable antenna. The antenna can be communicatively coupled to one or more additional components of the electronic device. Further, in some cases, the ceramic material of the substrate can allow the antenna to transmit and/or receive wireless signals with less interference, attenuation, or shielding, than if the housing were constructed entirely of, for example, a metal material. In some cases, the substrate may amplify or otherwise enhance, for example, by reducing noise or increasing the amplification of, wireless signals received and/or transmitted by the antenna.

In some cases, the antenna can be integrated or otherwise incorporated into the overmold material during a forming process of the overmold material. For example, in some cases the antenna can be positioned relative to the substrate and the overmold material can be formed or solidified around the antenna and the substrate in a single step. In some other cases, a portion of the overmold material can be formed at least partially surrounding the substrate in a first stage, then the antenna can be positioned relative to the first portion of the overmold material while a second portion of the overmold material is formed in a second stage, resulting in the antenna being substantially or entirely surrounded by the overmold material.

Methods and processes for forming composite components are also provided herein. For example, a method of forming a composite component can include overmolding a substrate including a ceramic material and an operational component, such as an antenna, with a moldable material so that the moldable material at least partially surrounds the substrate and the operational component. In some cases, the method can further include forming the substrate including a ceramic material by solidifying a matrix material at least partially around ceramic fibers. The methods can further include cutting or otherwise shaping the substrate into a desired shape. For example, the substrate can be machined, etched, cut with a laser, or otherwise processed to achieve a desired shape.

Although one or more of these components and/or processes can be described in the context of handheld devices, such as mobile phones, laptops, and notebooks, the embodiments disclosed herein should not be interpreted or otherwise used as limiting the scope of the disclosure, including the claims. In addition, the following description has broad application. Accordingly, the discussion of any embodiment is meant only to be exemplary and is not intended to suggest that the scope of the disclosure, including the claims, is limited to these embodiments.

These and other embodiments are discussed below with reference to FIGS. 1-13. However, the detailed description given herein with respect to these Figures is for explanatory purposes only and should not be construed as limiting.

FIG. 1 shows an embodiment of an electronic device 100. The electronic device shown in FIG. 1 is a watch, such as a smartwatch. The smartwatch of FIG. 1 is merely one representative example of a device that can be used in conjunction with the systems and methods disclosed herein. Electronic device 100 can correspond to any form of wearable electronic device, a portable media player, a media storage device, a portable digital assistant ("PDA"), a tablet computer, a computer, a mobile communication device, a GPS unit, a remote control device, or other electronic device. The electronic device 100 can be referred to as an electronic device, or a consumer device. Further details of the electronic device are provided below with reference to FIG. 2.

Figure 2:
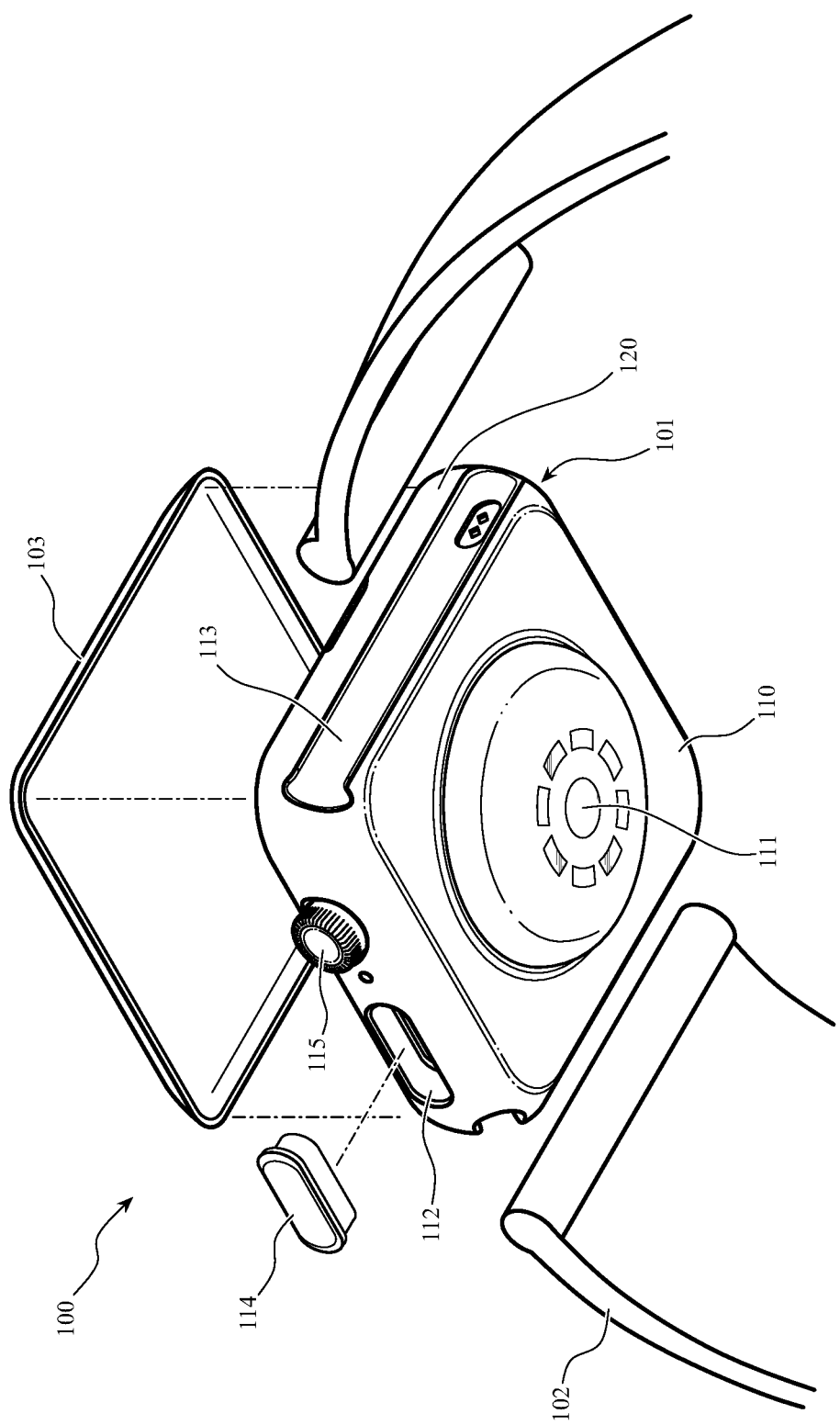
FIG. 2 shows and exploded view of the electronic device of FIG. 1.

Referring now to FIG. 2, the electronic device 100 can include a housing 101 and a cover 103 attached to the housing 101. The housing 101 can substantially define at least a portion of an exterior surface of the device 100. The cover 103 can include glass, plastic, or any other substantially transparent material, component, or assembly. The cover 103 can cover or otherwise overlay a display, a camera, a touch sensitive surface such as a touchscreen, or other component of the device 100. The cover 103 can define a front exterior surface of the device 100. Together, the housing 101 and the cover 103 can substantially define the exterior surface of the device 100.

In some examples, the housing 101 can include a component 110 that defines at least an exterior surface of the device 100. The component 110 can be referred to as a back case or a back cover, and in some cases, can be attached to one or more other components, such as frame 120, to form the housing 101. The component 110 can be attached to the frame 120 by any method known in the art or developed in the future, such as adhesive bonding, brazing, welding, overmolding, interference fitting, or other securing methods. In some cases, however, the component 110 can form or be the entire housing 101 of the electronic device 100. The component 110 can be a composite component, and can include a substrate having a ceramic material, an overmold material at least partially surrounding the substrate and forming an exterior surface of the component 110, and an operational component, such as an antenna, integrated or embedded into the overmold material.

The component 110 can include one or more apertures or through holes. A transparent material 111 can be disposed in the one or more apertures. In some cases, the transparent material 111 can be visually transparent and can include a ceramic material such as sapphire, or a polymer material such as a polyamide. The transparent material 111 can provide visual access to an exterior environment for one or more components of the device 100, as described with respect to FIG. 3.

The housing 101 can include one or more features to receive or couple to other components of the device 100. For example, the frame 120 can include features, such as an indentation 113 to receive strap 102, and an aperture 112 to receive a button 114. The component 110 can include any number of features such as apertures, cavities, indentations, and other mating features to receive and/or attach to one or more other components of the device 100.

Additionally or alternatively, other components of the electronic device 100, such as individual internal structural components or exterior input components, can be formed from or can include a substrate including a ceramic material and an overmold material at least partially surrounding the substrate and forming an exterior surface thereof. For example, in some cases, the device 100 can include input components, such as one or more buttons 114 and/or a crown 115, that can be formed from a composite component, as described herein. The composite component can provide strong and durable, yet relatively inexpensive, input components 114, 115. Further, the overmold material can result in input components 114, 115 that can have an aesthetically pleasing look and feel for the user.

The device 100 of FIGS. 1 and 2 is merely one example of an electronic device 100 that can include a composite component, such as the housing 101. Alternatively, the device 100 can include other components including or formed from composite components. For example, the device 100 can include components such as a stiffener, a frame, or other components that are formed from or can include a substrate that includes a ceramic material and an overmold material, at least partially surrounding the substrate, as described herein. Additional electronic devices and designs thereof, including one or more composite components as discussed herein, are expressly contemplated. Further details of example components are provided below with reference to FIG. 3.

Figure 3:
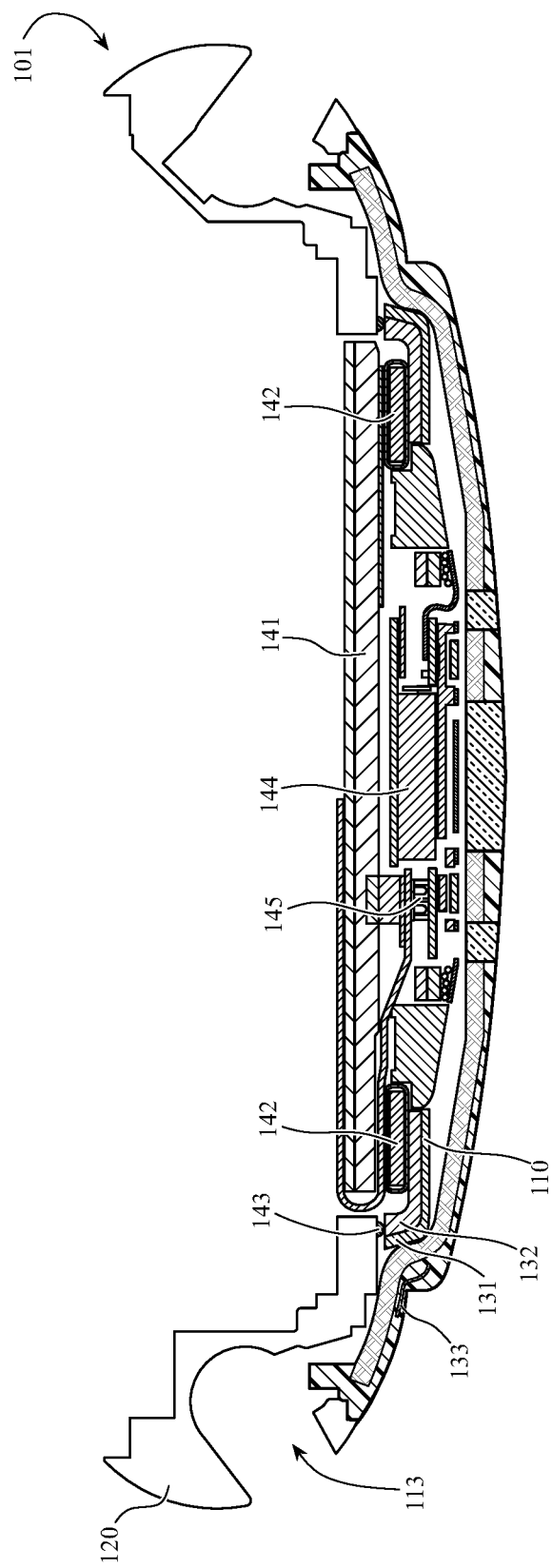
FIG. 3 shows a sectional view of an electronic device.

FIG. 3 shows a sectional view of electronic device 100, including internal components such as processors, memory, circuit boards, batteries, and sensors. Such components can be disposed within an internal volume defined at least partially by the housing 101, and can be affixed to the housing 101, via internal surfaces, attachment features, threaded connectors, studs, posts, and/or other fixing features, that are formed into, defined by, or otherwise part of the housing 101.

The device 100 can include internal components, such as a system in package (SiP) 141, including one or more integrated circuits such as a processors, sensors, and memory. The device 100 can also include a wireless charging coil 142. The wireless charging coil 142 can be coupled to a battery (not shown) housed in the internal volume of the device 100. The device 100 can also include one or more sensors 144, such as optical or other sensors, that can sense or otherwise detect information regarding the environment exterior to the housing 101. Additional components, such as a haptic engine 145, can also be included in the device 100. Other components, such as a battery, a display, and a speaker (all not shown) can be included or housed within the internal volume of the device 100.

As can be seen in FIG. 3, the housing 101 can include a back case or a back cover 110 and a frame 120. In some cases, the back cover 110 can be joined to the frame 120, and a gasket or seal 143 can be positioned between the back cover 110 and frame 120 to provide for a housing 101 that is substantially impervious to water and/or gases. The frame 120 can include one or more of a variety of materials. For example, the frame 120 can be formed from a metallic material, a ceramic material, an amorphous material such as glass, a polymeric material, and combinations thereof. In some examples, however, the entire housing 101 can be formed from or can be a composite component.

The back cover 110 can include a substrate 132 including a ceramic material. The substrate 132 can be, for example, ceramic fibers embedded in or at least partially surrounded by a matrix material. In some examples, the ceramic fibers can be substantially randomly positioned throughout the matrix material, while in some other examples the ceramic fibers can be arranged in a pattern such as a weave. In some cases, the substrate 132 can be a substantially unitary ceramic article and may not include a matrix material. The back cover 110 further includes an overmold material 131 at least partially surrounding the substrate 132 and forming at least a portion of an exterior surface of the back cover 110. In this example, the overmold material 131 forms a portion of the exterior surface of the device 100. In some cases where the overmold material 131 can include a polymer material, such as a polyamide material including glass fibers, the overmold material 131 can provide a pleasing look and feel to the exterior of the device 100, in addition to providing durability, resistance to environmental degradation, and other tangible benefits.

An operational component, such as an antenna 133, can be embedded in the overmold material 131 and can be communicatively coupled to one or more of the internal components of the device 100. The antenna 133 is illustrated as a metal sheet, although other forms of antennas are expressly contemplated. Further, in some cases, the back cover 110 can include two or more antennas embedded or at least partially surrounded by the overmold material 131. Additionally, although the antenna 133 is illustrated as being positioned along an edge of the back cover 110, the antenna 133 can be disposed at any location in the overmold material 131 of the back cover 110.

All or a portion of one or more internal components, for example, the SiP 141, can be formed from or include a composite component. In some embodiments, the composite component can allow for one or more of such internal components to be light, durable, strong, and inexpensive, as discussed herein. Further, the design of such components can allow for component architectures that may not have previously been able to be achieved.

The internal components, such as one or more of components 141, 142, 144, and 145, can be disposed within an internal volume defined, at least partially, by the housing 101. These components 141, 142, 144, and 145 can be affixed to the housing 101 via internal surfaces, attachment features, threaded connectors, studs, posts, and/or other fixing features, that are formed into, defined by, or otherwise part of the housing 101 and/or the cover 103.

The housing 101, including the back cover 110 formed from a composite component, can be conformable to interior dimensional requirements, as defined by the internal components, such as components 141, 142, 144, and 145. For example, the structure of the housing 101 including a composite back cover 110 can be defined or limited exclusively or primarily by the internal components the housing is designed to accommodate. That is, because a housing 101 including a composite back cover 110 can be extremely light and strong, the housing 101 can be shaped to house the interior components in a dimensionally efficient manner without being constrained by factors other than the dimensions of the components, such as the need for additional structural elements.

The composite component 110 of the housing 101 can also be formed by a variety of processes, as discussed herein. In some embodiments, these formation processes can allow for the housing 101 to have a detailed shape or design that is tailored specifically to satisfy one or more needs, such as internal dimensional requirements, without the need for additional features to reinforce the structure of the housing. Additionally, artifacts of the manufacturing process of the housing can be eliminated.

Any number or variety of components of an electronic device, for example, electronic device 100, can be formed from or can include a composite component. The structure of these composite components can be, for example, a substrate including a ceramic material and an overmold material at least partially surrounding the substrate. The structure and materials of the substrate and overmold material, and of the composite component itself, can apply not only to the specific examples discussed herein, but to any number or variety of embodiments. Various embodiments of composite components are described below, with specific reference to FIG. 4A.

Figure 4A:
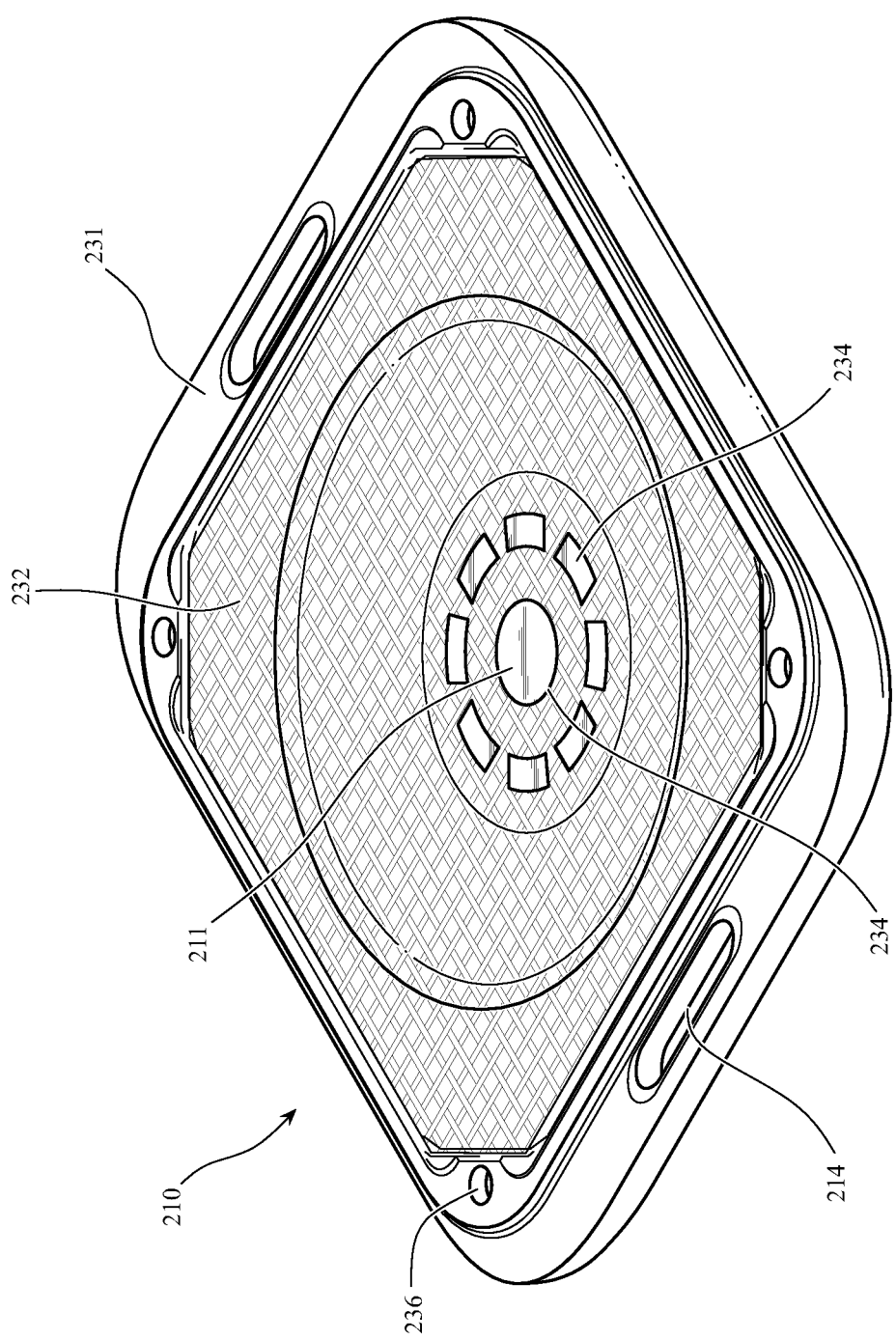
FIG. 4A shows a perspective view of a component of an electronic device.

FIG. 4A shows a perspective view of an example composite component 210 that can be, for example, part of a housing of an electronic device. In some cases, the composite component 210 can be a back cover of a housing for an electronic device. In some examples, the composite component 310 can be the entire housing of an electronic device.

The composite component 210 can include a substrate 232, including a ceramic material, and an overmold material 231 at least partially surrounding the substrate 232. In some examples, the overmold material 231 can form an exterior surface of the component 210. The component 210 can also include an antenna, or other electronic or operational component, integrated or embedded into the overmold material 231.

The substrate 232 can include a ceramic material. In some cases, the ceramic material can include, for example, ceramic fibers. The ceramic fibers can be embedded in or be at least partially surrounded by a matrix material to form the substrate 232, as described herein. In some instances, the ceramic fibers can be substantially randomly positioned throughout the matrix material. In other examples, the ceramic fibers can be arranged in a pattern, such as a weave. In some other examples, however, the ceramic material can include any shape or form of ceramic material. For example, the ceramic material can include ceramic particles, pellets, spheres, rods, tubes, fibers, or another form, in any amount or combination, embedded or at least partially surrounded by a matrix material to form the substrate 232. Additionally, the substrate 232 can include ceramic material and may not include a matrix material. For example, the substrate 232 can be a substantially unitary ceramic body having the shape and design of the substrate 232.

The ceramic material of the substrate 232 can include zirconia, alumina, or combinations thereof. Although, in some cases, the ceramic material of the substrate 232 can include any ceramic material known in the art or discovered in the future.

The substrate 232 can include one or more apertures 234 formed therein. For example, where the component 210 can be the back cover of an electronic device, the aperture or apertures 234 can allow one or more internal components of the electronic device to have visual or physical access to the environment exterior to the device. Thus, in some cases, the apertures 234 can be positioned, sized, and/or arranged to correspond to one or more internal components of an electronic device. In some cases, however, the apertures 234 can have alternative or additional purposes. For example, in some cases, the apertures 234 can serve to reduce the weight or amount of material included in the component 210.

The aperture or apertures 234 can be formed in the substrate at any point during the formation or manufacturing of the component 210. For example, the apertures 234 can be formed during the initial forming process of the substrate 232, such as an initial molding process. Alternatively, the apertures can be formed by a cutting process, such as a laser cutting process, that occurs at other stages during formation of the component 210.

The apertures 234 can have a material 211 disposed therein. In some examples, the material 211 disposed in the apertures 234 can have a peripheral shape corresponding to the shape of the apertures in which it is disposed. The material 211 can be a transparent material, such as an optically or visually transparent material. In some examples, the material 211 can be transparent to a desired wavelength of light. The transparent material 211 can serve to allow one or more internal components of an electronic device to have visual access to the environment exterior to the device, while still providing environmental protection to the internal components. In some cases, the transparent material 211 can be a polymeric material, a ceramic material, an amorphous material such as glass, or combinations thereof. For example, the transparent material 211 can be sapphire or a polyamide material.

An overmold material 231 can at least partially surround the substrate 232. The overmold material 231 can be any moldable material that is capable of being overmolded at least partially around the substrate 232. In some examples, the overmold material 231 can be a metallic material, an amorphous material such as glass, a polymeric material, or other appropriate material. In some cases, the overmold material 231 can be a polymer material, such as a polyamide material, although any polymeric material can be used. Further, one or more additional materials can be included in the moldable material of the overmold material 231. The overmold material 231 can be a polymeric material and can include additional materials disposed therein, such as glass or ceramic material. For example, the overmold material 231 can be a polyamide material and can include glass or ceramic fibers at least partially embedded therein.

As can be seen in FIGS. 4B and 4C, the overmold material 231 can surround and cover one or more exterior surfaces of the substrate 232, while one or more other exterior surfaces of the substrate 232 can be free of overmold material 231. For example, where the component 210 is a part of a housing of an electronic device, the overmold material 231 can cover a surface of the substrate 232 defining an exterior surface of the housing, while a surface of the substrate 232 defining an interior volume of the electronic device can be free of the overmold material 231. Alternatively, the overmold material 231 can completely or substantially surround the substrate 232. Thus, in some examples, an electronic device including the component 210 can have an exterior surface defined by the overmold material 231. Further, one or more electronic or operational components, such as an antenna, can be integrated into and/or at least partially surrounded by the overmold material 231.

While the overmold material 231 is depicted as a substantially unitary article in FIGS. 4A-F, the overmold material 231 can include one or more discrete or non-contiguous portions overmolded onto the substrate 232. Thus, in some examples, the overmold material 231 can define a portion of an external surface of a device including the component 210, while the substrate 231 may define a second, different portion of an external surface of the device. Similarly, a surface of the component 210 defining an internal volume or surface of an electronic device can be defined by one or more portions of the overmold material 231 and one or more different portions of the substrate.

In some examples where the overmold material 231 defines an exterior surface of a device including the component 210, the overmold material 231 can provide a pleasing look and/or feel to the surface of the device. The overmold material 231 can also serve to enhance the durability or toughness of the component 210. For example, the overmold material 231 can serve to absorb shocks and impacts during use to prevent or reduce cracking or chipping of the substrate 232.

The overmold material 231 can have any desired shape or design. For example, as illustrated in FIGS. 4A-4F, the overmold material 231 can at least partially surround the substrate 232 at a fixed or variable thickness and can additionally include one or more features, structures, protrusions, or elements. For example, the overmold material 231 can include one or more attachment features 236. The attachment features 236 can be, for example, positioned around a periphery of the substrate 232 and can secure the component 210 to one or more other components of an electronic device. The attachment features 236 can be designed or shaped to receive and engage a fixing member, such as a screw. For example, the engagement features 236 can include threads corresponding to threads of a screw. In some examples, the attachment features 236 can include a cavity, such as a cavity capable of receiving and retaining a fastener, like a nut that can receive a bolt. Other forms of attachment features 236 are expressly contemplated.

The ability to include an attachment feature 236 in the overmold material 231 of the component 210 can provide for significantly reduced processing costs and times for attaching the component 210, relative to a similarly structured component formed entirely of a ceramic material. In order to form attachment features in a component formed entirely of a ceramic material, extensive and delicate processing may be utilized to prevent defects. Accordingly, by forming attachment features 236 in the moldable and relatively easier to process or machine overmold material 231, the component 210 can have significantly reduced material and processing costs. Meanwhile, the substrate 232 including the ceramic material can still provide for a strong and rigid component 210 compared to a similar component formed entirely of the overmold material 231.

The overmold material 231 can additionally include one or more other desired structures or features. For example, the overmold material 231 can include an aperture 214. In some instances, the aperture 214 can be positioned in a protrusion or other portion of the overmold material 231 such that the apertures do not expose the substrate 232. Alternatively, a feature of the overmold material 231, such as an aperture, can expose or reveal an underlying portion of the substrate 232.

Further, in instances where the substrate 232 can include one or more apertures 234, the overmold material 231 can also include apertures corresponding in size, shape, and position to the apertures 234 in the substrate 232. In some examples, the apertures 234 of the substrate and the corresponding apertures of the overmold material 231 can be formed substantially simultaneously. In some other examples, however, the apertures 234 of the substrate 232 can be formed initially and the corresponding apertures of the overmold material 231 can be formed in a subsequent step.

The overmold material 231 can be formed at least partially around the substrate 232 by any number of additive manufacturing or molding processes. For example, the overmold material 231 can be formed by an injection molding process using a mold that contains the substrate 232. Alternatively, the overmold material 231 can be formed by an additive process, such as a 3D printing process. For example, an overmold material 231 can be 3D printed at least partially around the substrate 232. Processes such as 3D printing can allow for the formation of an overmold material 231 that can have a shape or include features that are not formable by other molding or manufacturing processes.

The overmold material 231 can be secured or adhered to the substrate 232 by the mechanical engagement between the overmold material 231 and the substrate 232. For example, in some examples, one or more features of the substrate 232 can mechanically engage with one or more corresponding features of the overmold material 231, to retain the overmold material 231 and the substrate 232 together. In some examples, an adhesive is not used to fasten or retain the overmold material 231 and the substrate 232 together. In other examples, and adhesive or other material can be included between the overmold material 231 and the substrate 232. Additionally, one or more surfaces of the substrate 232 can be prepared or subjected to a treatment prior to overmolding in order to retain the overmold material 231. For example, in some cases, a surface of the substrate 232 can be subjected to an etching or blasting process that can create microstructures for the overmold material 231 to mechanically engage with.

The construction of the component 210, including a substrate 232 with a ceramic material and an overmold material 231 at least partially surrounding the substrate, can provide for a component 210 that has a high level of strength and rigidity relative to a similar component made substantially or entirely from the overmold material. The enhanced strength provided by the substrate 232 can allow the component 210 to be substantially smaller and lighter than a component made entirely of a polymeric material that has a similar or reduced strength. Further, the relatively low amount of ceramic material included in the component 210 relative to a component made entirely of ceramic material can result in significantly decreased costs and processing time, while maintaining a similar or only slightly reduced level of strength and rigidity. The overmold material 231 can also serve to protect the substrate 232 from chipping and environmental degradation during use. As noted above, the substrate 232 and the overmold material 231 can be combined in any number of configurations, as described below with reference to FIGS. 5A-8C.

FIG. 5A shows a top view of an example composite component 310 that can be part of a housing of an electronic device, as described herein. As shown in FIG. 5A, the composite component includes a ceramic composite substrate 332 with an overmold material 331 substantially covering the exterior portion of the ceramic composite substrate. In some cases, the composite component 310 can be a housing or a back cover of a housing for an electronic device. In some examples, the composite component 310 can be the entire housing of an electronic device. The composite component 310 can be substantially similar to, and can include some or all of the features of other composite components described herein, such as, composite component 210 described with respect to FIGS. 4A-4F.

FIG. 5B shows a perspective cut-away view of the composite component 310, while FIG. 5C shows a sectional view of the component 310. As can be seen from the figures, the component 310 can include a substrate 332 including a ceramic material, and an overmold material 331 at least partially surrounding the substrate 332. In some cases, the overmold material 331 can form an exterior surface of the component 310. The component 310 can also include an antenna 333 or other electronic or operational component integrated or embedded into the overmold material 331.

As can be seen in FIG. 5C, the overmold material 332 can substantially or entirely cover a lower surface of the substrate 332, and any side surfaces of the substrate 332. The overmold material 332 can also at least partially cover a top surface of the substrate 332. In some examples, such an arrangement of the overmold material 331 can serve to retain the overmold material 331 around the substrate 332. The component 310 can also include one or more apertures 334 including a transparent material 311 disposed therein.

In some cases, the overmold material 331 covering the substrate 332 can have a substantially uniform thickness. In other embodiments, the thickness of the overmold material 331 can vary along the substrate 332. The overmold material 331 can be from about 0.25 mm thick to about 1 mm thick, or thicker. In some examples, the overmold material 331 can have an average thickness of about 0.5 mm, excluding any features or protrusions of the overmold material 331. Structures or features of the overmold material 331, for example, protrusions or attachment features, can have a thickness of up to several millimeters or even a centimeter or more.

The substrate 332 can include a ceramic material. The ceramic material can include, for example, ceramic fibers. The ceramic fibers can be embedded in, or at least partially surrounded by, a matrix material to form the substrate 332, as described herein. In some cases, the ceramic fibers can be arranged in a pattern, such as a weave, with one or more fibers arranged in specific orientations. In some examples, one or more ceramic fibers can extend substantially an entire major dimension of the substrate 332, such as, one or more of a height, width, or length of the substrate. In some cases where the fibers are arranged in a pattern, the pattern can be a plain weave, a twill weave, a satin weave, a jacquard weave, a unidirectional pattern, a tri-axial pattern, or any other known fiber pattern.

In some cases, ceramic fibers can be randomly distributed or positioned throughout the matrix material, while in other cases, the ceramic fibers can be arranged in a pattern, such as a weave. In some examples, however, the ceramic material can include any shape or form of ceramic material. For example, the ceramic material can include ceramic particles, pellets, spheres, rods, tubes, fibers, or other geometries, in any amount or combination, embedded or at least partially surrounded by a matrix material to form the substrate 332. Additionally, in some cases, the substrate 332 can include ceramic material and may not include a matrix material. For example, the substrate 332 can be a substantially unitary ceramic body having the shape and design of the substrate 332.

Further, as shown in FIGS. 5B and 5C, the component 310 can include an operational component, such as an antenna 333, at least partially surrounded by the overmold material 331. In some cases, the antenna 333 can be positioned substantially adjacent to the substrate 332, although in other cases, the antenna 333 can be positioned at any location at least partially within the overmold material 331. One or more portions of the antenna 333 can be configured to connect to, or communicate with, other components of an electronic device.

The antenna 333 can include or be formed from a metal material. For example, the antenna 333 can include copper, nickel, aluminum, other conducting materials, and combinations thereof. In some cases, however, the antenna 333 can include any desired material, as long as it can molded with or covered by the overmold material 331. In some examples, the antenna 333 can include a substantially flat sheet of metal. In other examples, the antenna 333 can include any desired shape to receive and/or transmit wireless signals of one or more desired frequencies. In some examples, the antenna 333 can receive and/or transmit wireless signals at one or more frequencies and can be one or more cellular antenna such as an LTE antenna, a Wi-Fi antenna, a Bluetooth antenna, a GPS antenna, a multi-frequency antenna, or other wireless antenna. The antenna 333 can be communicatively coupled to one or more additional components of an electronic device. Further, in some cases, the ceramic material of the substrate 332 can allow the antenna 333 to transmit and/or receive wireless signals with less interference, attenuation, or shielding than if the antenna 333 was included in a component made entirely of a metal or other housing material. In some cases, the substrate 332 may amplify or otherwise enhance wireless signals received and/or transmitted by the antenna, for example, by reducing noise or increasing the amplification of the signals.

In some cases, the antenna 333 can be integrated or otherwise incorporated into the overmold material 331 during a forming process of the overmold material 331. For example, in some cases, the antenna 333 can be positioned relative to the substrate 332, such as in a mold, and the overmold material 331 can be formed or solidified around the antenna 333 in a single step. In other examples, a portion of the overmold material 331 can first be formed at least partially surrounding the substrate 332, followed by the antenna 333 being disposed relative to the first portion of the overmold material 331. A second portion of the overmold material 331 can then be formed in a second stage, to substantially or entirely surround the antenna 333 with the overmold material 331. Additional details of alternative component configurations are provided with reference to FIGS. 6A-6B.

Figure 6A:
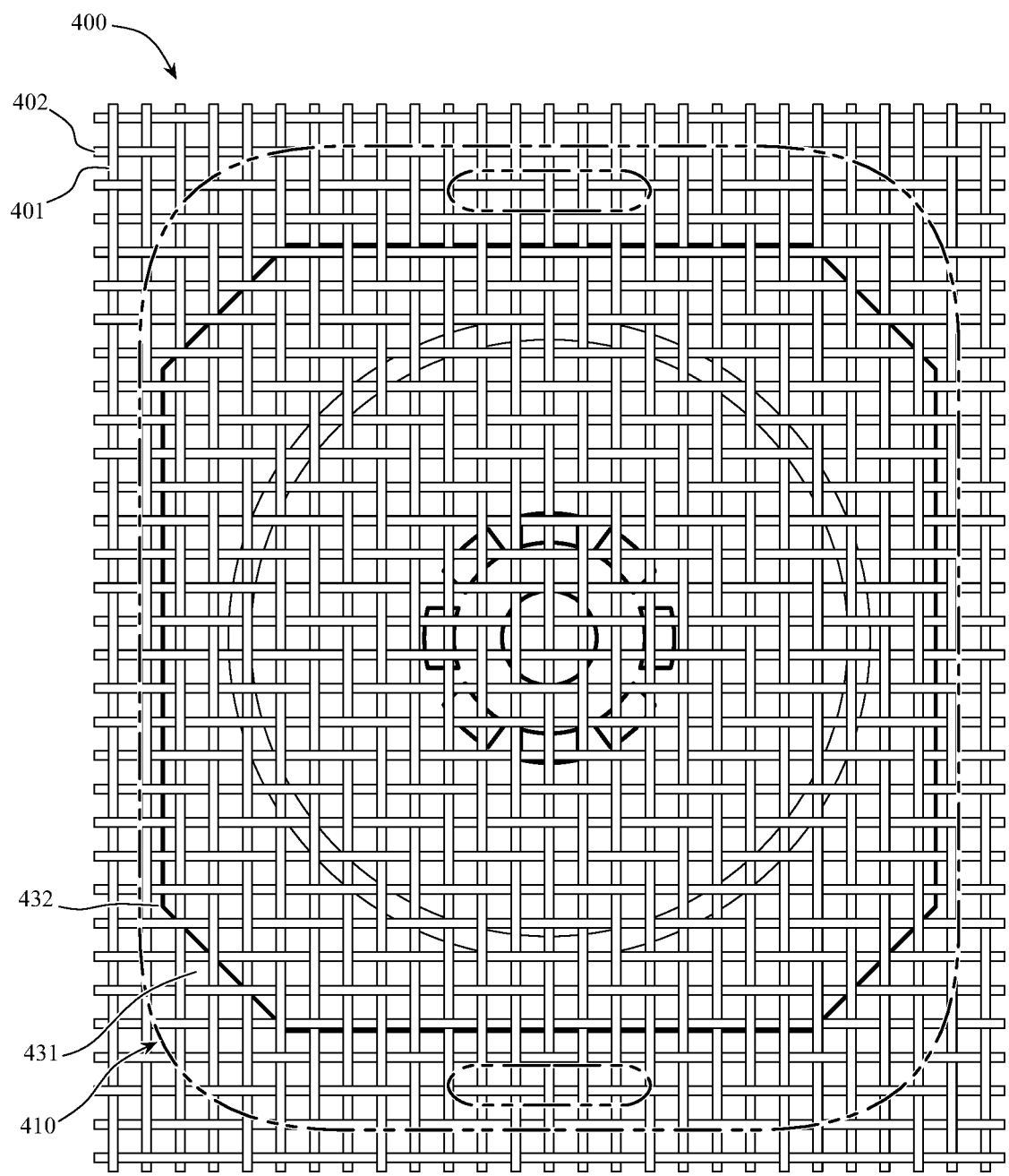
FIG. 6A shows a top schematic view of a component of an electronic device.
Figure 6B:
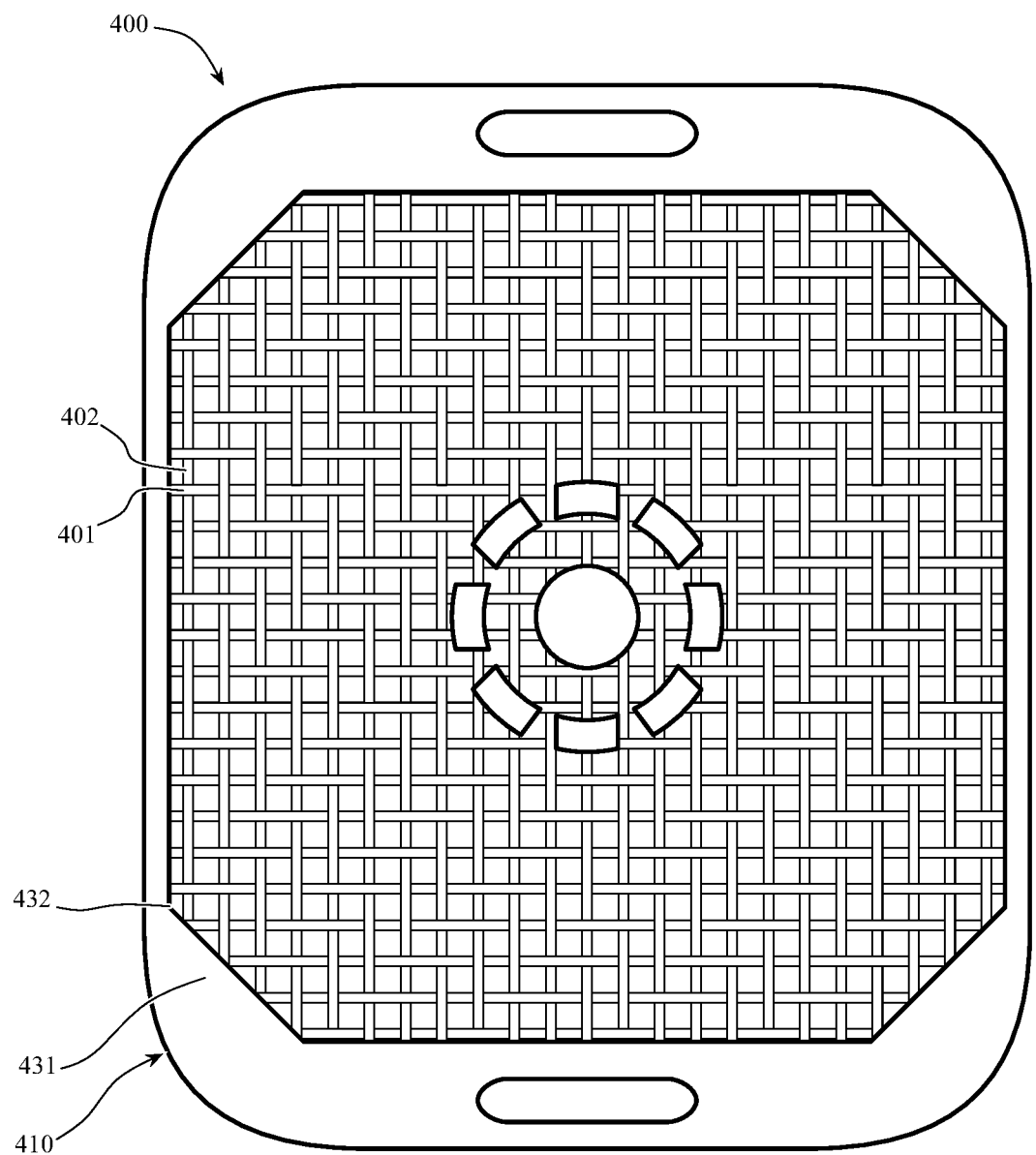
FIG. 6B shows a top schematic view of a component of an electronic device.

FIGS. 6A and 6B show a top schematic view of a composite component 410, according to one example. The component 410 can be, for example, part of a housing of an electronic device. In some examples, the composite component 410 can be a housing or a back cover of a housing for an electronic device. In some examples, the composite component 410 can be the entire housing of an electronic device. The composite component 410 can be substantially similar to and can include some or all of the features of other composite components described herein, such as, composite component 210 and 310 described with respect to FIGS. 4A-4F and 5A-5C.

FIG. 6A illustrates one possible arrangement of ceramic fibers 401, 402, that can be at least partially surrounded by a matrix material to form a substrate 432 of a component 410. As illustrated, in some cases, during or prior to the formation of the substrate 432 the ceramic fibers 401, 402 arranged in a weave can extend past the boundaries of the substrate 432. In some cases, the fibers 401, 402 can be at least partially surrounded by a matrix material and then cut or sized, as desired. In some cases, the fibers 401, 402 of the pattern or weave can be substantially entirely surrounded by a matrix material and any fibers 401, 402 and/or matrix material extending or disposed outside a desired shape of the substrate 432 can be cut or otherwise removed from the substrate 432.

In some cases, for example as depicted in FIG. 6B, the fibers 401, 402 can be cut or otherwise sized prior to at least partially surrounding with a matrix material, so that a weave or pattern of the fibers 401, 402 has substantially a same peripheral shape as the peripheral shape of the substrate 432. Thus, in some other examples, the fibers 401, 402 can be cut, sized, or arranged, as desired, prior to being partially surrounded by the matrix material. The ceramic fibers 401, 402 can include any ceramic material, such as zirconia, alumina, or combinations thereof. Further, in some cases, the fibers 401, 402 can be cut or otherwise formed to include one or more features of the substrate 432, such as one or more apertures. For example, as illustrated in FIG. 6B, the fibers 401, 402 of the pattern or weave can be cut to remove those portions of the fibers 401, 402 that would otherwise overlay or occlude an aperture formed in the substrate 432.

The ceramic material of the substrate 432 can include a first set of fibers 401 arranged in a first direction and a second set of fibers 402 arranged in a second direction. In some examples, the first and second directions can be substantially perpendicular to one another, although other arrangements are expressly contemplated to vary the relative strength of the substrate in specific directions and orientations. In some examples, the one or more ceramic fibers 401, 402 can extend substantially across an entire major dimension of the substrate 432, such as, one or more of a height, width, or length of the substrate.

The fibers 401, 402 can be arranged in the substrate 432 according to a pattern, such as a weave. The fibers 401, 402 of FIGS. 6A and 6B are shown as arranged in a twill weave pattern, although any other desired pattern can be used. For example, in some cases, the pattern can be a plain weave, a twill weave, a satin weave, a jacquard weave, a unidirectional pattern, a tri-axial pattern, or any other pattern. In some cases, the matrix material at least partially surrounds the fibers 401, 402 and can be a moldable or curable material, such as an epoxy or resin. In some examples, the matrix material can be any thermoset polymer, thermoplastic polymer, or combinations thereof. The matrix material can include metallic material, amorphous materials such as glass, polymeric materials, and/or combinations thereof. The matrix material can also be substantially transparent to electromagnetic signals. The design flexibility provided by the use of ceramic fibers can allow for a composite component made entirely of the composite material, without or substantially free of overmold material, as detailed below with reference to FIGS. 7A-7C.

FIG. 7A shows a top view of an example composite component 510 that can be, for example, part of a housing of an electronic device. As shown in FIGS. 7A-7C, the example composite component 510 is entirely formed of a ceramic composite substrate 532 without, or substantially free of, overmold material. In some examples, the composite component 510 can be a back cover of a housing for an electronic device. Alternatively, the composite component 510 can be the entire housing of an electronic device.

As seen in FIGS. 7B and 7C, the component 510 can be a substantially contiguous and/or unitary body that can include a ceramic material 437. That is, in some cases, the substrate 532 can have a same shape as the component 510, and can be free of any overmold material. Thus, in some examples, the component 510 can include a ceramic material 437 at least partially embedded in a matrix material. In some examples, and as illustrated in FIGS. 7A-7C, the ceramic material 437 can include ceramic fibers. The ceramic fibers 437 can be randomly positioned and/or oriented throughout the matrix material. The component 510 can also include one or more apertures 534, including a transparent material 511 disposed therein.

Further, as shown in FIGS. 7B and 7C, the component 510 can include an operational component, such as an antenna 533, at least partially surrounded by the matrix material of the substrate 532. In other examples, the antenna 533 can be positioned at any location at least partially within the substrate 532. For example, where the antenna 533 is substantially or entirely surrounded by the substrate 532, one or more portions of the antenna 533 configured to connect to or communicate with other components of an electronic device can be protruding from or be otherwise free of the substrate 532.

The antenna 533 can include or be formed from a metal material. For example, the antenna 533 can include copper, nickel, aluminum, similar conductive metals, and combinations thereof. In some cases, however, the antenna 533 can include any desired material, as long as it can be formed with the substrate 532. In some examples, the antenna 533 can include a substantially flat sheet of metal. Although, in some other cases, the antenna 533 can assume any desired shape configured to receive and/or transmit wireless signals of one or more desired frequencies. In some cases, the antenna 533 can receive and/or transmit wireless signals at one or more frequencies and can be, for example, one or more of a cellular antenna such as an LTE antenna, a Wi-Fi antenna, a Bluetooth antenna, a GPS antenna, a multi-frequency antenna, or any other wireless signal antenna. The antenna 533 can be communicatively coupled to one or more additional components of an electronic device. Further, in some cases, the ceramic material 537 of the substrate 532 can allow the antenna 533 to transmit and/or receive wireless signals with less interference, attenuation, or shielding, than if the antenna 533 was included in a component made entirely of a metal or other housing material. In some cases, the substrate 532 may amplify or otherwise enhance wireless signals received and/or transmitted by the antenna, for example, by reducing noise or increasing the amplification of the signals. Additional configurations, including a composite component with a partially exposed ceramic composite and a partially overmolded portion, are detailed below with reference to FIGS. 8A-8C.

Figure 8C:
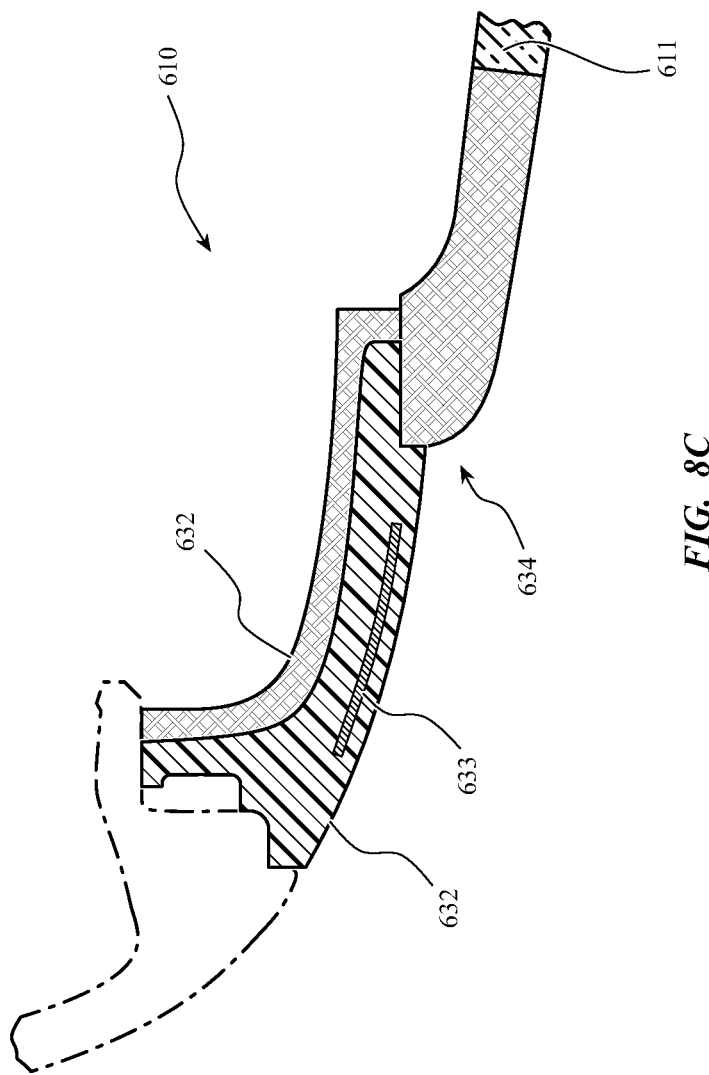
FIG. 8C shows a sectional view of a component of the electronic device of FIG. 8A.

FIG. 8A shows a top view of an example composite component 610 that can be, for example, a housing or part of a housing of an electronic device. As shown in FIGS. 8A-8C, the example composite component can have a substrate 632 including a ceramic composite and an overmold material 631 that partially covers or surrounds the substrate. In some cases, the composite component 610 can be a back cover of a housing for an electronic device. In some examples, the composite component 610 can be the entire housing of an electronic device. The composite component 610 can be substantially similar to, and can include some or all of the features of other composite components described herein.

FIG. 8B shows a sectional view of the composite component 610 and FIG. 8C illustrates a close-up sectional view of the component 610. As can be seen from the figures, the component 610 can include a substrate 632 including a ceramic material and an overmold material 631 at least partially surrounding the substrate 632. In some cases, the overmold material 631 can form an exterior surface of the component 610. The component 610 can also include an antenna 633 or other electronic component integrated or embedded into the overmold material 631.

The substrate 632 can include a ceramic material. In some cases, the ceramic material can include a substantially contiguous and/or unitary body of ceramic material. Thus, in some cases, the substrate 632 may not include a matrix material. For example, the substrate 632 can include a unitary body of zirconia or alumina material, although any ceramic material can be used. The substrate can have any desired size or shape. As discussed herein, the ceramic body of the substrate 632 can impart high strength and rigidity to the component 610, while the use of an overmold material 631 around the ceramic body of the substrate can provide for reduced processing costs and time, as well as providing protection to the substrate 632 from chipping or environmental attack.

Further, as shown in FIGS. 8B and 8C, the component 610 can include an operational component, such as an antenna 633, at least partially surrounded by the overmold material 631. In some cases, the antenna 633 can be positioned substantially adjacent to the substrate 632, while in other examples, the antenna 633 can be positioned at any location at least partially within the overmold material 631. In some examples, where the antenna 633 is substantially or entirely surrounded by the overmold material 631, one or more portions of the antenna 633 configured to connect to or communicate with other components of an electronic device can extend from or beyond the overmold material 631.

The antenna 633 can include or be formed from a metal material. For example, the antenna 633 can include copper, nickel, aluminum, any other metal material, and combinations thereof. In some cases, however, the antenna 633 can include any desired material, as long as it is capable of being formed within the overmold material 631. In some cases, the antenna 633 can include a substantially flat sheet of metal. In other examples, the antenna 633 can assume any desired shape to receive and/or transmit wireless signals of one or more desired frequencies. In some examples, the antenna 633 can receive and/or transmit wireless signals at one or more frequencies and can be, for example, one or more of a cellular antenna such as an LTE antenna, a Wi-Fi antenna, a Bluetooth antenna, a GPS antenna, a multi-frequency antenna, and/or another similar antenna. The antenna 633 can be communicatively coupled to one or more additional components of the electronic device. Further, the ceramic material of the substrate 632 can allow the antenna 633 to transmit and/or receive wireless signals with less interference, attenuation, or shielding, than if the antenna 633 was included in a component made entirely of a metal or another housing material. In some cases, the substrate 632 can amplify or otherwise enhance wireless signals received and/or transmitted by the antenna, for example, by reducing noise or increasing the amplification of the signals.

The antenna 633 can be integrated or otherwise incorporated into the overmold material 631 during a forming process of the overmold material 631 as part of the component 610. For example, the antenna 633 can be positioned relative to the substrate 632, such as in a mold, and the overmold material 631 can then be formed or solidified around the antenna 633. In some other examples, a portion of the overmold material 631 can first be formed at least partially surrounding the substrate 632, followed by the antenna 633 being positioned relative to the first portion of the overmold material 631. A second portion of the overmold material 631 can then be formed to substantially or entirely surround the antenna 633. Additional configurations are provided below with reference to FIGS. 9A-10B.

Figure 9A:
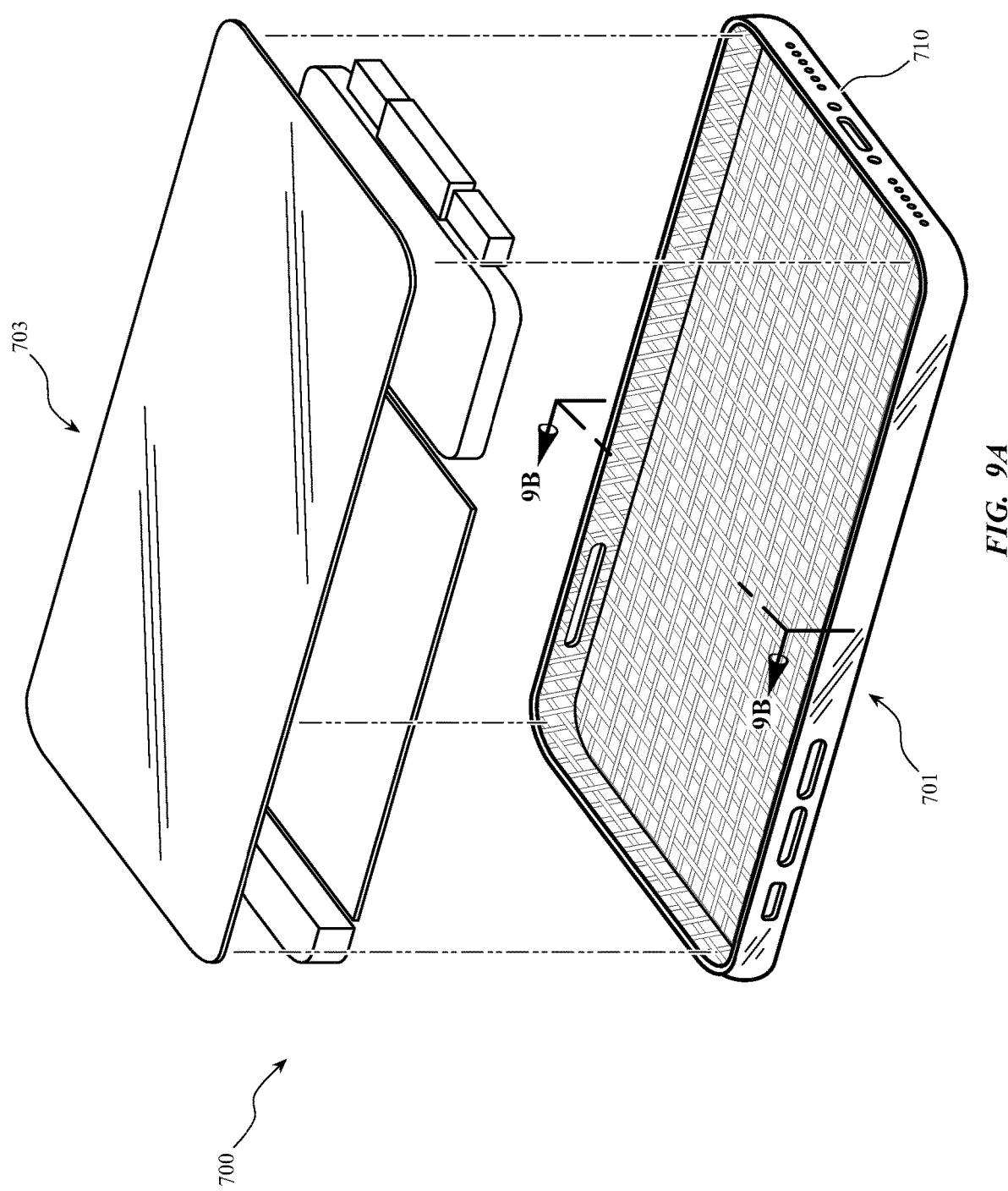
FIG. 9A shows an exploded view of an electronic device.

As shown in FIG. 9A, the present configuration can be used in the formation of a housing 701 for any electronic device, including a mobile phone or a smart phone 700. As shown, the smart phone 700 includes a front screen cover 703 and a housing 701 defined by a composite component 710. As noted above, the composite component 710 can be either a portion of the housing 701 or the entire housing of the smart phone 700.

Figure 9B:
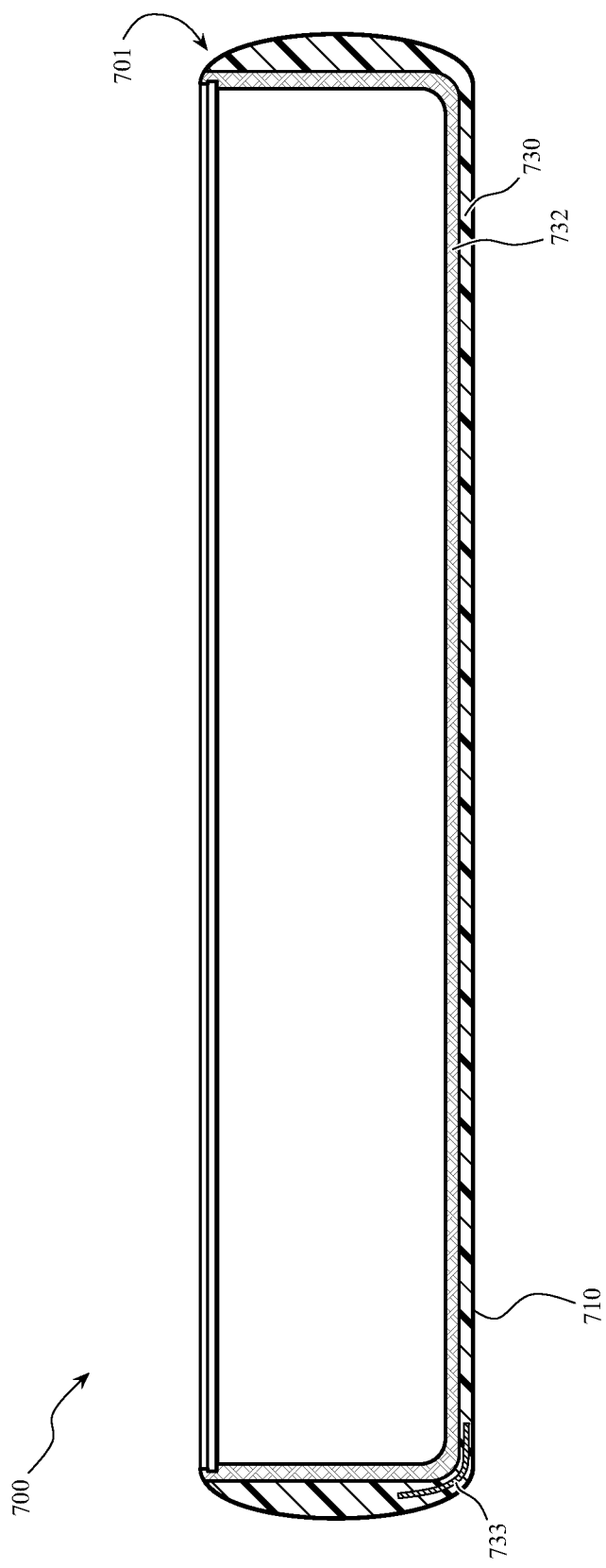
FIG. 9B shows a sectional view of a component of the electronic device of FIG. 9A.

FIG. 9B shows a sectional view of the composite component 710. As can be seen in FIG. 9B, the composite component 710 can include a substrate 732 including a ceramic material and an overmold material 731 at least partially surrounding the substrate 732. In some cases, the overmold material 731 can form an exterior surface of the composite component 710, and the resulting smart phone 710. The composite component 710 can also include an antenna 733 or other electronic or operational component integrated or embedded into the overmold material 731.

Similar to the embodiments detailed above, the substrate 732 can include a ceramic material as either a substantially contiguous and/or unitary body of ceramic material, a ceramic weave in a matrix, or as ceramic particles distributed within a matrix. As detailed above, each of these configurations impart high strength and rigidity to the component 710, while the use of an overmold material 731 around the ceramic body of the substrate can provide for reduced processing costs and time, as well as providing protection to the substrate 732 from chipping or environmental attack.

The antenna 733 can be at least partially surrounded by the overmold material 731. In some examples, the antenna 733 can be positioned substantially adjacent to the substrate 732, while in other examples the antenna 733 can be positioned at any location at least partially within the overmold material 731. Similar to the antenna detailed above, the antenna 733 can include or be formed from a metal material, such as copper, nickel, aluminum, any other metal material, and combinations thereof. In some cases, the ceramic material of the substrate 732 can allow the antenna 733 to transmit and/or receive wireless signals with less interference, attenuation, or shielding, than if the antenna 733 was included in a component made entirely of a metal or another housing material. In some cases, the substrate 732 can amplify or otherwise enhance wireless signals received and/or transmitted by the antenna, for example, by reducing noise or increasing the amplification of the signals. Alternatively, the present configuration can be incorporated into a tablet computer, as shown in FIGS. 10A and 10B.

Figure 10A:
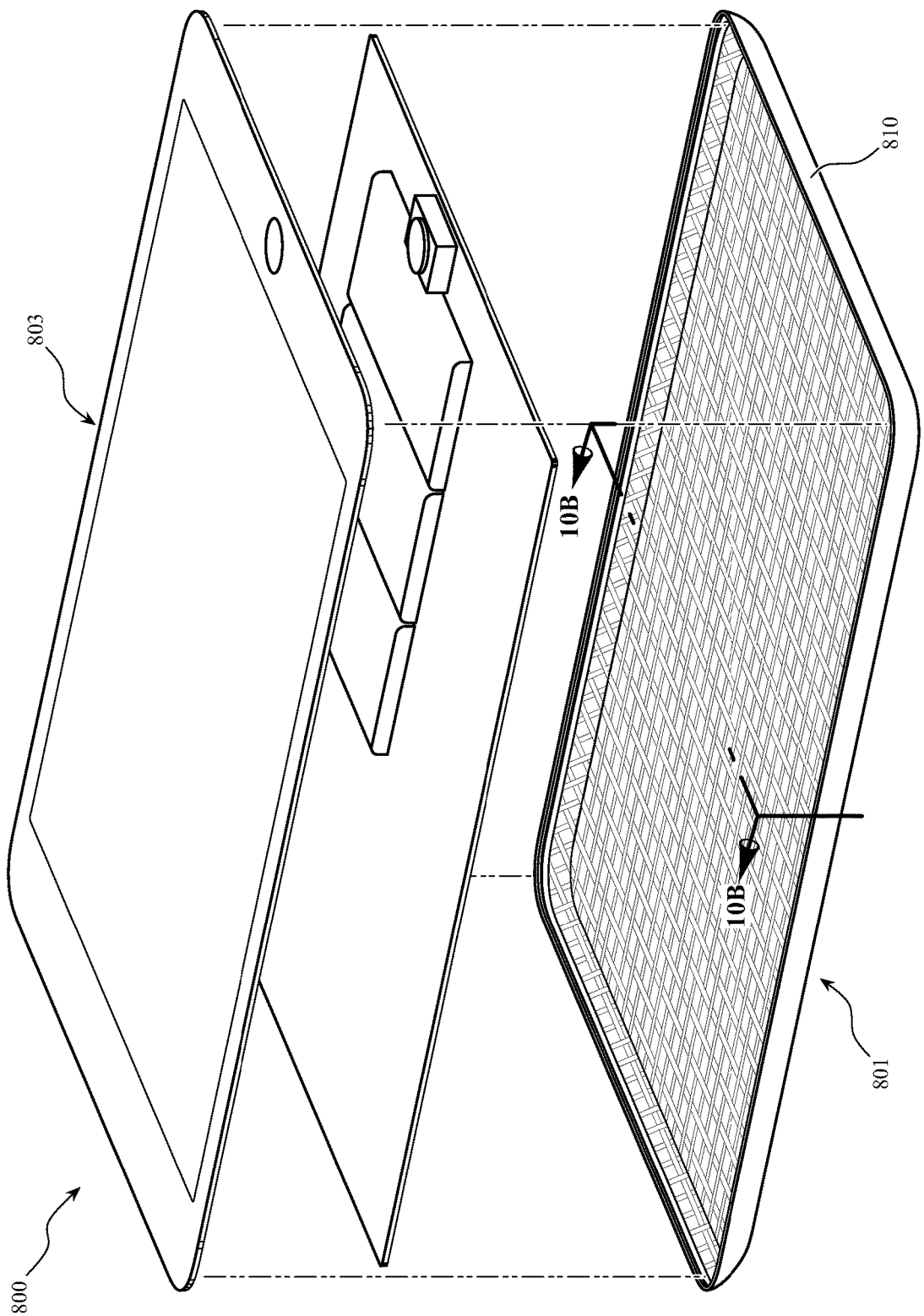
FIG. 10A shows an exploded view of an electronic device.

As shown in FIG. 10A, the present configuration can also be used in the formation of a housing 801 for a tablet computer 800. As shown, the tablet computer 800 includes a front screen cover 803 and a housing 801 defined by a composite component 810. The composite component 810 can be either a portion of the housing 801, or the entire housing of the tablet computer 800.

Figure 10B:
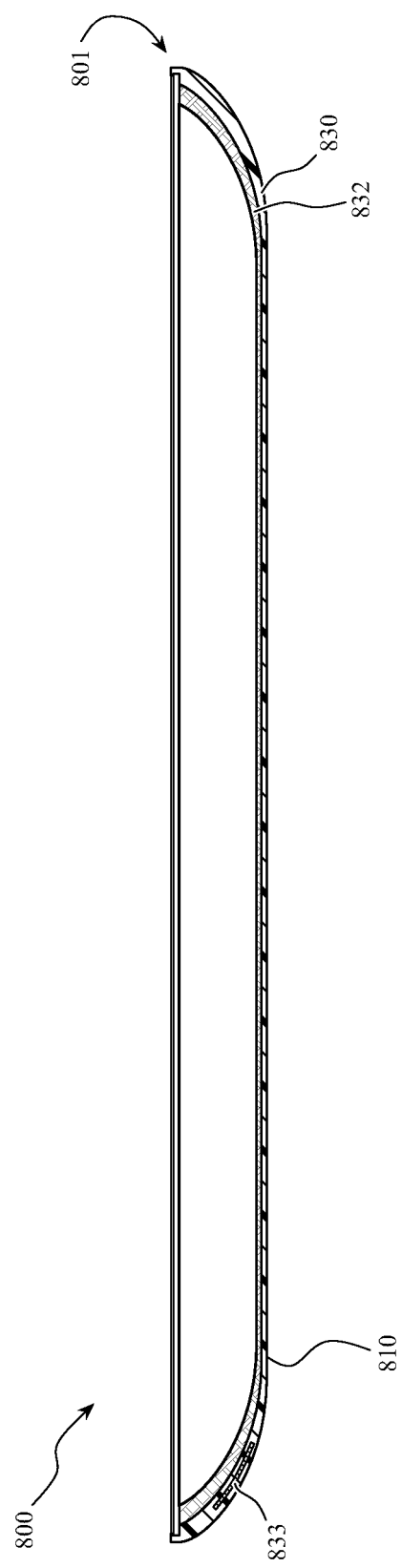
FIG. 10B shows a sectional view of a component of the electronic device of FIG. 10A.

FIG. 10B shows a sectional view of the composite component 810. As can be seen in FIG. 10B, the composite component 810 can include a substrate 832 including a ceramic material and an overmold material 831 at least partially surrounding the substrate 832. In some cases, the overmold material 831 can form an exterior surface of the composite component 810, and the resulting smart phone 810. The composite component 810 can also include an antenna 833 or other electronic component integrated or embedded into the overmold material 831.

Similar to the embodiments detailed above, the substrate 832 can include a ceramic material as either a substantially contiguous and/or unitary body of ceramic material, a ceramic weave in a matrix, or as ceramic particles distributed within a matrix. As detailed above, each of these configurations impart high strength and rigidity to the component 810, while the use of an overmold material 831 around the ceramic body of the substrate can provide for reduced processing costs and time, as well as providing protection to the substrate 832 from chipping or environmental attack.

Similar to the examples provided above, the antenna 833 can be at least partially surrounded by the overmold material 831. In some examples, the antenna 833 can be positioned substantially adjacent to the substrate 832, while in other examples the antenna 833 can be positioned at any location at least partially within the overmold material 831. The antenna 733 can include or be formed from a metal material, such as copper, nickel, aluminum, any other metal material, and combinations thereof. In some cases, the ceramic material of the substrate 832 can allow the antenna 833 to transmit and/or receive wireless signals with less interference, attenuation, or shielding, than if the antenna 833 was included in a component made entirely of a metal or another housing material. In some cases, the substrate 832 can amplify or otherwise enhance wireless signals received and/or transmitted by the antenna, for example, by reducing noise or increasing the amplification of the signals. Details regarding forming the present antenna-permeable structure is provided below, with reference to FIGS. 11-13.

Figure 11:
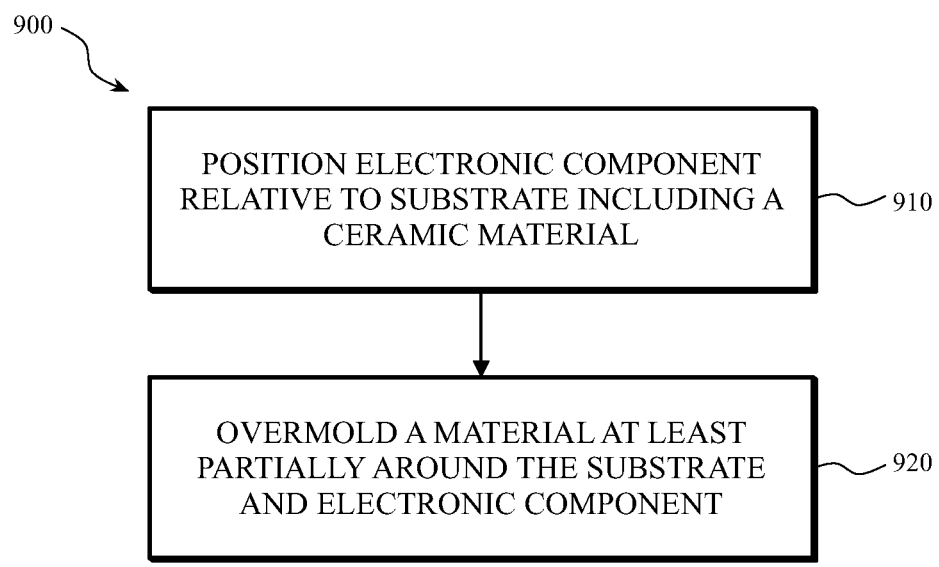
FIG. 11 shows a process flow diagram of a process for forming a component of an electronic device.

FIG. 11 illustrates a process flow diagram of an exemplary process for forming a composite component, as described herein. The process 900 for forming the component can include positioning an electronic or operational component, such as an antenna, relative to a substrate including a ceramic material at block 910 and overmolding a material at least partially around the substrate and the electronic component at block 920.

At block 910, an electronic component is positioned relative to a substrate including a ceramic material. The substrate can include some or all of the features of the substrates described herein. For example, the substrate can include a ceramic material at least partially surrounded by a matrix material. The ceramic material can include ceramic fibers, for example, randomly disposed through the matrix material or arranged in a pattern such as a weave.

The electronic component can be positioned relative to the substrate, for example, in a desired position when at least partially surrounded by the overmold material. The electronic component and the substrate can be held in this arrangement by any apparatus or method known in the art or developed in the future. For example, the electronic component and the substrate can be held relative to one another in a mold. In some cases, the electronic component can be an antenna or another operational component, as described herein.

At block 920, a moldable material can be overmolded so that it at least partially surrounds the substrate and the electronic component. In some examples, the material can be overmolded at least partially around both the substrate and the electronic component in a single step. For example, the substrate and the electronic component can be positioned relative to one another in a mold and the material can be injection molded over the substrate and electronic component. In some cases, a portion of the overmold material can first be formed to at least partially surround the substrate, followed by the electronic component being positioned relative to the first portion of the overmold material while a second portion of the material is overmolded around both the substrate and the antenna, substantially or entirely surrounding the antenna with overmold material. Thus, in some cases, block 920 can occur or take place both before and after the positioning of the electronic component in block 910.

The overmold material can be a metallic material, an amorphous material, a polymeric material, a composite material, or combinations thereof. In some cases, the overmold material can be a polymer material such as a polyamide material, although any polymeric material can be used. Further, in some cases, one or more additional materials can be included in the moldable material of the overmold material. For example, the overmold material can be a polyamide material and can include glass fibers embedded therein.

The material can be overmolded at block 920 by any number of additive manufacturing or molding processes. For example, in some cases, the overmold material can be formed by an injection molding process using a mold that contains the substrate and the electronic component. In other examples, the material can be overmolded by an additive process, such as a 3D printing process. For example, a material can be 3D printed at least partially around the substrate and an electronic component, as described herein. 3D printing and other precise manufacturing processes can allow for the formation of an overmold material that can assume a shape or include features that cannot be formed by other molding or manufacturing processes.

Figure 12:
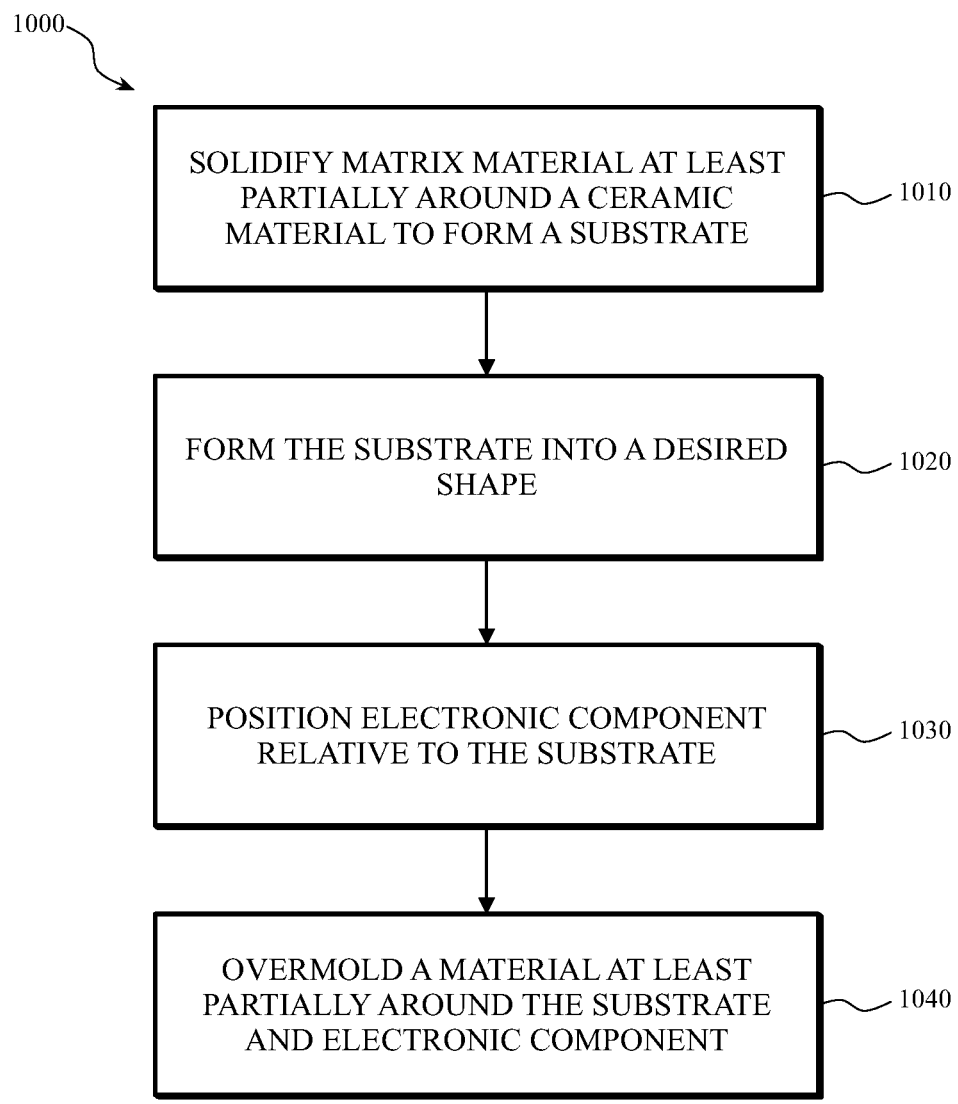
FIG. 12 shows a process flow diagram of a process for forming a component of an electronic device.

FIG. 12 illustrates a process flow diagram of another exemplary process for forming a composite component. According to FIG. 12, the process 1000 for forming the component can include solidifying a matrix material at least partially around a ceramic material to form a substrate at block 1010. The substrate can then be formed into a desired shape at 1020. An electronic component, such as an antenna, can then be positioned relative to the substrate at block 1030. As shown in block 1040, a material can then be overmolded at least partially around the substrate and the electronic component.

At block 1010, a matrix material is solidified at least partially around a ceramic material. The ceramic material can include any of the ceramic materials described herein, in any combination. For example, the ceramic material can include ceramic fibers. In some cases, the ceramic fibers can be substantially randomly positioned throughout the matrix material, while in some other cases, the ceramic fibers can be arranged in a pattern such as a weave. The ceramic material can include or assume any shape or form of ceramic material. For example, the ceramic material can include ceramic particles, pellets, spheres, rods, tubes, fibers, or other geometries in any amount or combination. In some cases, the ceramic material can be a substantially contiguous and/or a substantially unitary ceramic body. The ceramic material can include zirconia, alumina, or combinations thereof.

In some cases, the ceramic material can be positioned in a mold or other apparatus in a desired orientation and the matrix material can be molded at least partially around the ceramic material. Any process for forming a matrix material around the ceramic material can be used, such as, a molding or injection molding process. In some cases, the matrix material can be a thermoset polymer, such as an epoxy or resin. In some cases, the matrix material can be a thermoplastic polymer. In some cases, the matrix material can be a combination of any thermoset and thermoplastic polymer. In some cases, the matrix material can be provided at least partially around the ceramic material in a liquid or viscous form and can then be solidified by curing or cooling to form a substrate. In some other cases, the matrix material can include any matrix material described herein.

At block 1020, the substrate can be formed into a desired shape. In some cases, block 1020 can occur substantially simultaneously with block 1010. That is, the matrix material can be solidified around the ceramic material into a desired shape. In some cases, however, further processing of the substrate can occur after the matrix material has solidified to form the substrate into a desired shape. For example, any subtractive manufacturing process can be used to form the substrate into a desired shape, including forming one or more features therein, such as apertures. In some cases, the substrate can be cut or machined into a desired shape. For example, a laser-cutter can be used to form the substrate into a desired shape.

At block 1030, an electronic component is positioned relative to a substrate including a ceramic material. The substrate can include some or all of the features of the substrates described herein. The electronic component can be positioned relative to the substrate, in a desired position when at least partially surrounded by the overmold material. The electronic component and the substrate can be held in this arrangement by any apparatus or method known in the art or developed in the future. For example, the electronic component and the substrate can be held relative to one another in a mold. In some cases, the electronic component can be an antenna.

At block 1040, a moldable material can be overmolded so that it at least partially surrounds the substrate and the electronic component. In some cases, the material can be overmolded at least partially around the substrate and the electronic component in a single step process. For example, the substrate and electronic component can be positioned relative to one another in a mold and the material can be injection molded over the substrate and electronic component. In some cases, a portion of the overmold material can be formed at least partially surrounding the substrate in a first stage, and the electronic component can be positioned relative to the first portion of the overmold material while a second portion of the material is overmolded around the substrate and the electronic components so that the electronic component is substantially or entirely surrounded by the overmold material. Thus, in some cases, block 1030 can occur or take place both before and after the positioning of the electronic component in block 1040.

The material overmolded at least partially around the substrate and the electronic component can be a metallic material, an amorphous material, a polymeric material, or any other moldable material. In some cases, the overmold material can be a polymer material such as a polyamide material, although any polymeric material can be used. Further, in some cases, one or more additional materials can be included in the moldable material of the overmold material. For example, the overmold material can be a polyamide material and can include glass fibers embedded therein.

The material can be overmolded at block 1040 by any number of additive manufacturing or molding processes. For example, in some cases, the overmold material can be formed by an injection molding process using a mold that contains the substrate and the electronic component. In other examples, the material can be overmolded by an additive process, such as a 3D printing process. For example, a material can be 3D printed at least partially around the substrate and an electronic component, as described herein. 3D printing and other precise manufacturing processes can allow for the formation of an overmold material that can assume a shape or include features that cannot be formed by other molding or manufacturing processes.

Figure 13:
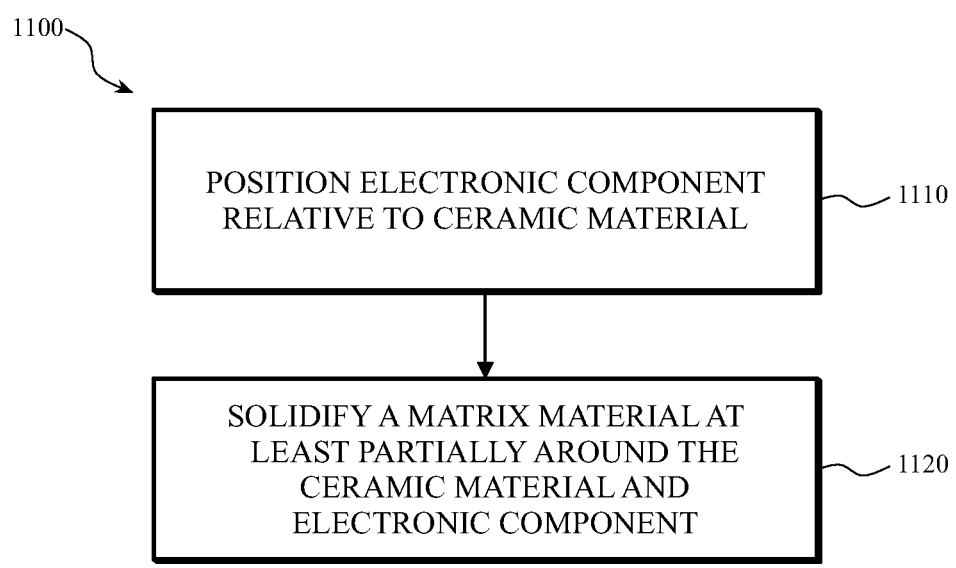
FIG. 13 shows a process flow diagram of a process for forming a component of an electronic device.

FIG. 13 illustrates a process flow diagram of another exemplary process for forming a composite component. The process 1100 for forming the component can include positioning an electronic component, such as an antenna, relative to a ceramic material at block 1110 and solidifying a matrix material at least partially around the electronic component and the ceramic material at block 1120.

At block 1110, an electronic component is positioned relative to a ceramic material. The ceramic material can include some or all of the features of the ceramic materials described herein. For example, the ceramic material can include ceramic fibers, for example, randomly disposed or oriented, or arranged in a pattern such as a weave.

The electronic component can be positioned relative to the ceramic material, for example, in a desired position when at least partially surrounded by the matrix material. The electronic component and the ceramic material can be held in this arrangement by any apparatus or method known in the art or developed in the future. For example, the electronic component and the ceramic material can be held or positioned relative to one another in a mold. In some cases, the electronic component can be an antenna.

At block 1120, a matrix material is solidified at least partially around the ceramic material and the electronic component. The ceramic material can include any of the ceramic materials described herein, in any combination. For example, the ceramic material can include ceramic fibers. In some cases, the ceramic fibers can be substantially randomly positioned throughout the matrix material, while in some other cases, the ceramic fibers can be arranged in a pattern such as a weave. The ceramic material can include any shape or form of ceramic material. For example, the ceramic material can include ceramic particles, pellets, spheres, rods, tubes, fibers, or other shape or form in any amount or combination. In some cases, the ceramic material can be a substantially contiguous and/or a substantially unitary ceramic body. The ceramic material can include zirconia, alumina, or combinations thereof.

In some cases, the ceramic material and electronic component can be positioned in a mold or other apparatus in a desired orientation and the matrix material can be molded at least partially around the ceramic material and the electronic component. Any process for forming a matrix material around the ceramic material and electronic component can be used, for example, a molding or injection molding process. In some cases, the matrix material can be a thermoset polymer, such as an epoxy or resin. In some cases, the matrix material can be a thermoplastic polymer. In some cases, the matrix material can be any combination of thermoset and thermoplastic polymers. In some cases, the matrix material can be disposed at least partially around the ceramic material and/or electronic component in a liquid or viscous form, and can then be solidified by curing or cooling to form a substrate. In some other cases, the matrix material can include any matrix material, as described herein, or combinations thereof.

In some cases, the matrix material can be solidified around the ceramic material and electronic component in a single step process. For example, the ceramic material and electronic component can be positioned relative to one another in a mold and the material can be injection molded over the ceramic material and the electronic component. In some examples, a portion of the matrix material can be formed at least partially surrounding the ceramic material in a first stage, and the electronic component can be positioned relative to the first portion of the matrix material while a second portion of the matrix material is solidified around the ceramic material and the electronic component, so that the electronic component is substantially or entirely surrounded by the matrix material. Thus, in some cases, block 1120 can occur or take place before, during, and/or after the positioning of the electronic component in block 1110.

Any of the features or aspects of the composite components discussed herein can be combined or included in any varied combination. For example, the design and shape of the substrate and/or overmold material is not limited in any way and can be formed by any number of processes, including those discussed herein. Further, the overmold material can be overmolded at least partially around the substrate at any time, even during formation of the substrate, and by any number of processes, including those discussed herein. A composite component, as discussed herein, can be or can form all or a portion of a component, such as a housing, for an electronic device. The composite component can also be or form any number of additional components of an electronic device, including internal components, external components, cases, surfaces, or partial surfaces.

Various inventions have been described herein with reference to certain specific embodiments and examples. However, they will be recognized by those skilled in the art that many variations are possible without departing from the scope and spirit of the inventions disclosed herein, in that those inventions set forth in the claims below are intended to cover all variations and modifications of the inventions disclosed without departing from the spirit of the inventions. The terms "including:" and "having" come as used in the specification and claims shall have the same meaning as the term "comprising."

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not meant to be exhaustive or to limit the embodiments to the precise forms disclosed. It will be apparent that many modifications and variations are possible in view of the above teachings.

What is claimed is:

1. A housing of an electronic device, comprising:
   a substrate partially defining an internal volume of the electronic device and including ceramic fibers arranged in a weave pattern and embedded in a matrix material;
   an overmold material at least partially surrounding the substrate and at least partially defining an exterior surface of the electronic device; and
   an operational component integrated into the overmold material and positioned between the substrate and the exterior surface.

2. The housing of claim 1, further comprising:
   an aperture passing through the substrate and the overmold material;
   a transparent element positioned within the aperture; and
   the overmold material including an attachment feature.

3. The housing of claim 1, wherein the operational component comprises an antenna.

4. The housing of claim 3, wherein the substrate amplifies a signal transmitted by the antenna.

5. The housing of claim 1, wherein the ceramic fibers comprise zirconia or alumina.

6. The housing of claim 1, wherein the matrix material comprises a thermoset polymer, thermoplastic polymer, or combinations thereof.

7. The housing of claim 1, wherein the overmold material comprises a polymer.

8. The housing of claim 1, wherein the weave pattern comprises a fabric weave pattern.

9. The housing of claim 8, wherein the weave pattern comprises a satin weave.

10. A component of an electronic device, comprising:
    a substrate including a ceramic material;
    an overmold material at least partially surrounding the substrate and at least partially defining an exterior surface of the electronic device; and
    an operational component at least partially surrounded by the overmold material, the operational component positioned between the substrate and the exterior surface.

11. The component of claim 10, wherein the substrate comprises ceramic fibers embedded in a matrix material.

12. The component of claim 11, wherein the ceramic fibers are arranged in a weave pattern.

13. The component of claim 11, wherein the ceramic fibers are substantially randomly oriented throughout the substrate.

14. The component of claim 11, wherein the matrix material comprises a thermoset polymer, thermoplastic polymer, or combinations thereof.

15. The component of claim 10, wherein the ceramic material comprises zirconia or alumina.

16. The component of claim 10, wherein the overmold material comprises a polymer.

17. A method of forming a component of an electronic device, comprising:
    solidifying a matrix material at least partially around ceramic fibers to form a substrate;
    cutting the substrate into a desired shape;
    disposing an operational component adjacent to the substrate; and
    overmolding the substrate and the operational component with a moldable material so the moldable material at least partially surrounds the substrate and the operational component, the moldable material contacting the substrate and comprising a material different from the substrate.

18. The method of claim 17, wherein cutting the substrate comprises laser-cutting the substrate to form an aperture.

19. The method of claim 17, wherein the ceramic fibers are arranged in a weave pattern.

20. The method of claim 17, wherein the ceramic fibers are substantially randomly oriented throughout the matrix material.

* * * * *